(12) United States Patent
Li et al.

(10) Patent No.: US 7,180,940 B2
(45) Date of Patent: Feb. 20, 2007

(54) FAST PHASE SYNCHRONIZATION AND RETRIEVAL OF SEQUENCE COMPONENTS IN THREE-PHASE NETWORKS

(76) Inventors: Chunlin Li, 1406-30 Charles Street West, Toronto, Ontario (CA) M4Y 1R5; Francis Dawson, 57 Monsheen Drive, Woodbridge, Ontario (CA) L4L 2E6

(*) Notice: Subject to any disclaimer, the term of this patent is extended or adjusted under 35 U.S.C. 154(b) by 766 days.

(21) Appl. No.: 10/407,901

(22) Filed: Apr. 4, 2003

(65) Prior Publication Data
US 2003/0223488 A1 Dec. 4, 2003

Related U.S. Application Data

(60) Provisional application No. 60/423,994, filed on Nov. 6, 2002, provisional application No. 60/369,937, filed on Apr. 4, 2002.

(51) Int. Cl.
*H03K 5/159* (2006.01)
*H03H 7/30* (2006.01)

(52) U.S. Cl. ..................... 375/232; 375/350

(58) Field of Classification Search ............... 375/350, 375/232; 307/46, 56; 363/95, 98
See application file for complete search history.

(56) References Cited

U.S. PATENT DOCUMENTS 4,097,692 A * 6/1978 Felix .................. 370/436
6,400,258 B1 6/2002 Parker
6,741,417 B2 * 5/2004 Hsin et al. ............ 360/78.05
2003/0091122 A1 * 5/2003 Humphreys et al. ....... 375/295

OTHER PUBLICATIONS

Liccardo et al., A New Robust Phase Tracking System For Asymmetrical And Distorted Three Phase Networks, Sep. 12-15, 2004, Harmonics and Quality of Power, 2004, 11th International Conference on, pp. 525-530.*
Dawson, F. P. et al., "Variable Sample Rate Delayless Frequency-Adaptive Digital Filter for Synchronized Signal Acquisition and Sampling", IEEE Transactions on Industrial Electronics, vol. 46, No. 5, Oct. 1999, pp. 889-896.
Schweitzer, E. O., III, et al., "Filtering for Protective Relays", IEEE Transactions on Power Delivery, vol. 7, No. 3, Jul. 1993, pp. 15-23.
Vainio, O. et al., "Digital Filtering for Robust 50/60Hz Zero-Crossing Detectors", IEEE Transactions on Instrumentation and Measurement, vol. 45, No. 2, Apr. 1996, pp. 426-430.
Ashok Kumar, B. S., "Time Delay Compensation for High Speed Digital Protection", IEEE Transactions on Power Delivery, vol. PWRD-1, No. 4, Oct. 1986, pp. 68-73.

(Continued)

*Primary Examiner*—Emmanuel Bayard
*Assistant Examiner*—Lawrence Williams
(74) *Attorney, Agent, or Firm*—Synnestvedt & Lechner LLP

(57) ABSTRACT

This invention relates to a method and system for fast retrieval of the sequence components from phase, frequency and amplitude varying signals and synchronization therewith, and the concept of a system on a chip for power signal processing. More specifically, it relates to a method and system where the sequence components of a three-phase power signal are extracted and filtered in real time using a multirate phase-locked loop and a dual infinite impulse response filter with fault detection and reinitialization.

14 Claims, 18 Drawing Sheets

System configuration for a power signal processor using the dual IIR filter with fault detection and re-initialization.

Region A: The dual IIR filter with fault detection and re-initialization.

OTHER PUBLICATIONS

Stewart, R. W. et al., "Oversampling and Sigma-Delta Strategies for Data Conversion", Electronics & Communication Engineering Journal, Feb. 1998, pp. 37-46.

Wang, L., "Frequency responses of Phasor-Based Microprocessor Relaying Algorithms", IEEE Transactions on Power Delivery, vol. 14, No. 1, Jan. 1999, pp. 98-109.

Song, H. et al., "An Instantaneous Phase Angle Detection Algorithm Under Unbalanced Line Voltage Condition", Power Electronics Specialists Conference, PESC'99, 30th Annual IEEE 1999, vol. 1, pp. 533-537.

Malengret, A. et al., "Negative Sequence Current Cancellation with DSP and Space Vector Controlled PWM Modulated Inverter", Communications and Signal Processing, COMSIG'98, Proceedings of the 1998 South African Symposium on, 1998, pp. 237-242.

Coury, D. V. et al., "Digital Filters Applied to Computer Relaying", IEEE Transactions on Power Delivery, vol. PWRD-1, No. 4, Oct. 1998, pp. 1062-1066.

Ashok Kumar, B. S. et al., "Envelope Compensation for High Speed Digital Protection", IEEE Transactions on Power Delivery, vol. 7, No. 3, Jul. 1992, pp. 1139-1147.

Al-Ahmad, H. et al., "A Novel Technique for Initializing Digital IIR Filters with a Finite Number of Samples at a Single Frequency", IEEE Transactions on Circuits and Systems—II: Analog and Digital Signal Processing, vol. 44, No. 5, May 1997, pp. 417-420.

Chornoboy, E. S., "Initialization for Improved IIR Filter Performance", IEEE Transactions on Signal Processing, vol. 40, No. 5, Mar. 1992, pp. 543-550.

Montero-Hernández, O. C. et al., "A Fast Detection Algorithm Suitable for Mitigation of Numerous Power Quality Disturbances", Industry Applications Conference, Thirty-Sixth IAS Annual Meeting, 2001, vol. 4, pp. 2661-2666.

Hussein, A. I. et al., "Design and Verification Techniques Used in a Graduate Level VHDL Course", Frontiers in Education Conference, 1999, FIE '99. 29th Annual, vol. 2, pp. 13A4/28-13A4/31.

Dattatreya, G. R., "A Systematic Approach to Teaching Binary Arithmetic in a First Course", IEEE Transactions on Education, vol. 36 No. 1, Feb. 1993, pp. 163-168.

Chung, J. et al., "New robust voltage sag disturbance detector using an adaptive prediction error filter", IEEE Power Engineering Society Summer Meeting, vol. 1, 1999, pp. 512-517.

Bhavaraju, V. B. et al., "Analysis and Design of an Active Power Filter for Balancing Unbalanced Loads", 23rd Annual Power Electronics Specialists Conference, PESC'92 Record, IEEE, 1992, vol. 2, pp. 1214-1220.

Alfudhaid, A. S. et al., "A Recursive Least-Squares Digital Distance Relaying Algorithm", IEEE Transactions on Power Delivery, vol. 14, No. 4, Oct. 1999, pp. 1257-1262.

Karimi, M. et al., "Wavelet Based On-line Disturbance Detection for Power Quality Applications", IEEE Transactions on Power Delivery, vol. 15, No. 4, Oct. 2000, pp. 1212-1220.

Deng, D. et al., "FPGA Implementation of PWM Pattern Generators", Canadian Conference on Electrical and Computer Engineering, 2001, vol. 1, pp. 225-230.

Karimi-Ghartemani, M. et al., "A New Phase-Locked Loop (PLL) System", Proceedings of the 44th IEEE 2001 Midwest Symposium on Circuits and Systems, vol. 1, No. 14-17, Aug. 2001, pp. 421-424.

Karimi-Ghartemani, M. et al., A Nonlinear Adaptive Filter for Online Signal Analysis in Power Systems: Applications:, IEEE Transactions on Power Delivery, vol. 17, No. 2, Apr. 2002, pp. 617-622.

* cited by examiner

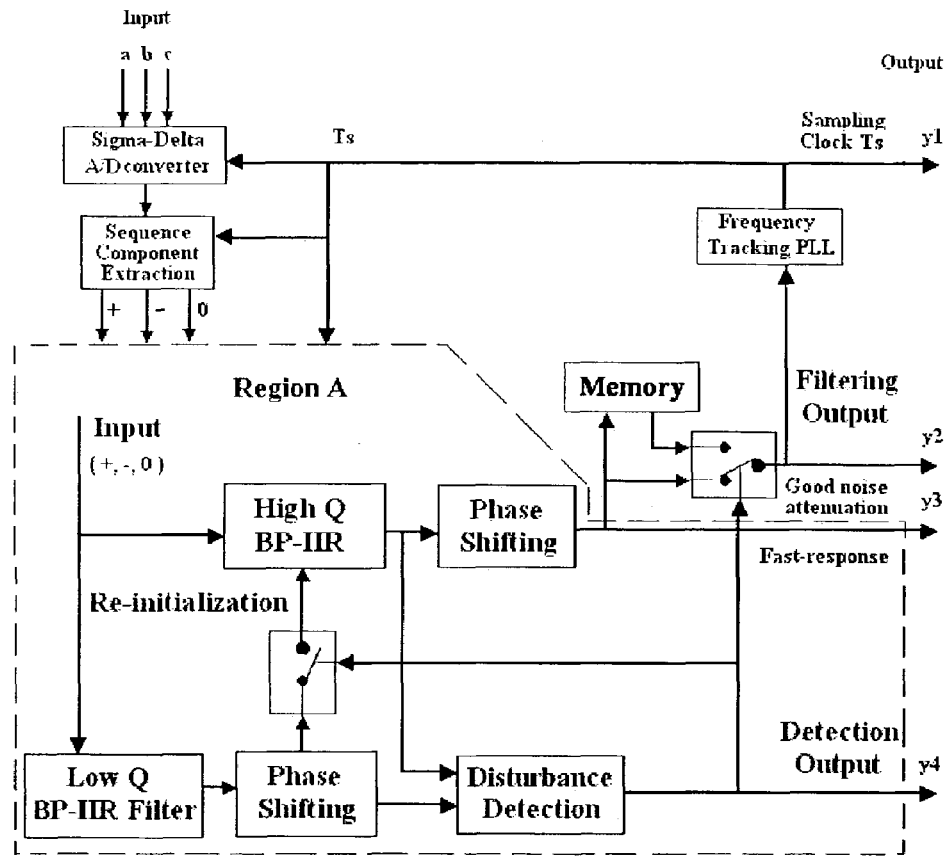
Figure 1: System configuration for a power signal processor using the dual IIR filter with fault detection and re-initialization.
Region A: The dual IIR filter with fault detection and re-initialization.

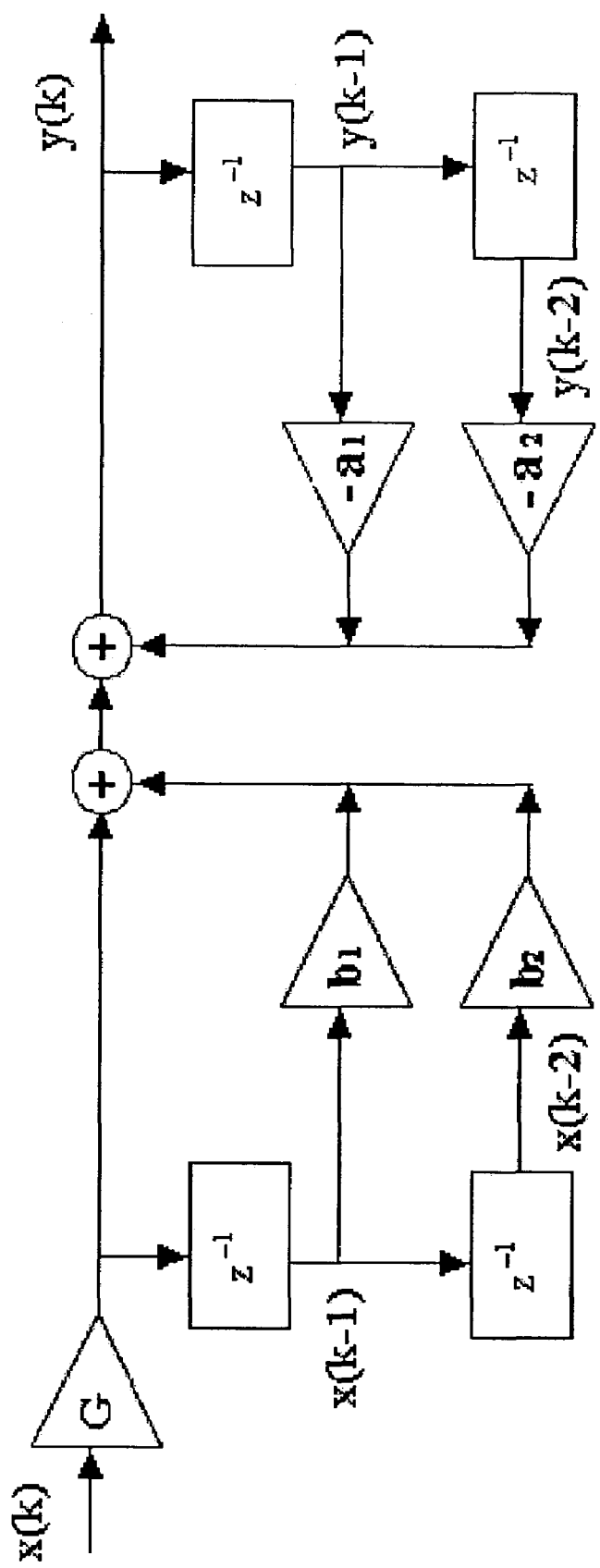
Figure 2 Direct realization of a second order IIR filter

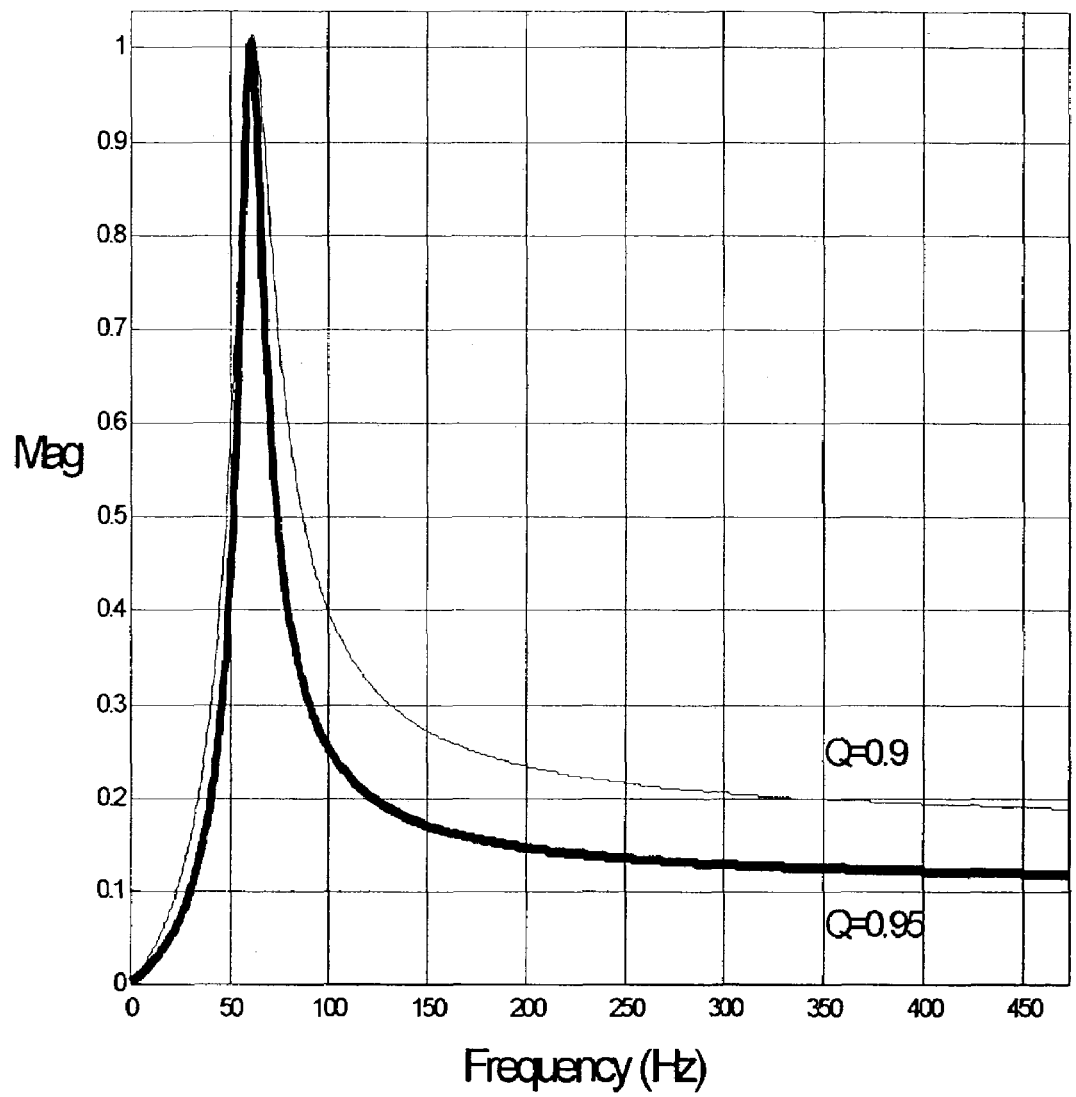
Figure 3 Frequency response of two bandpass IIR filters with different Qs

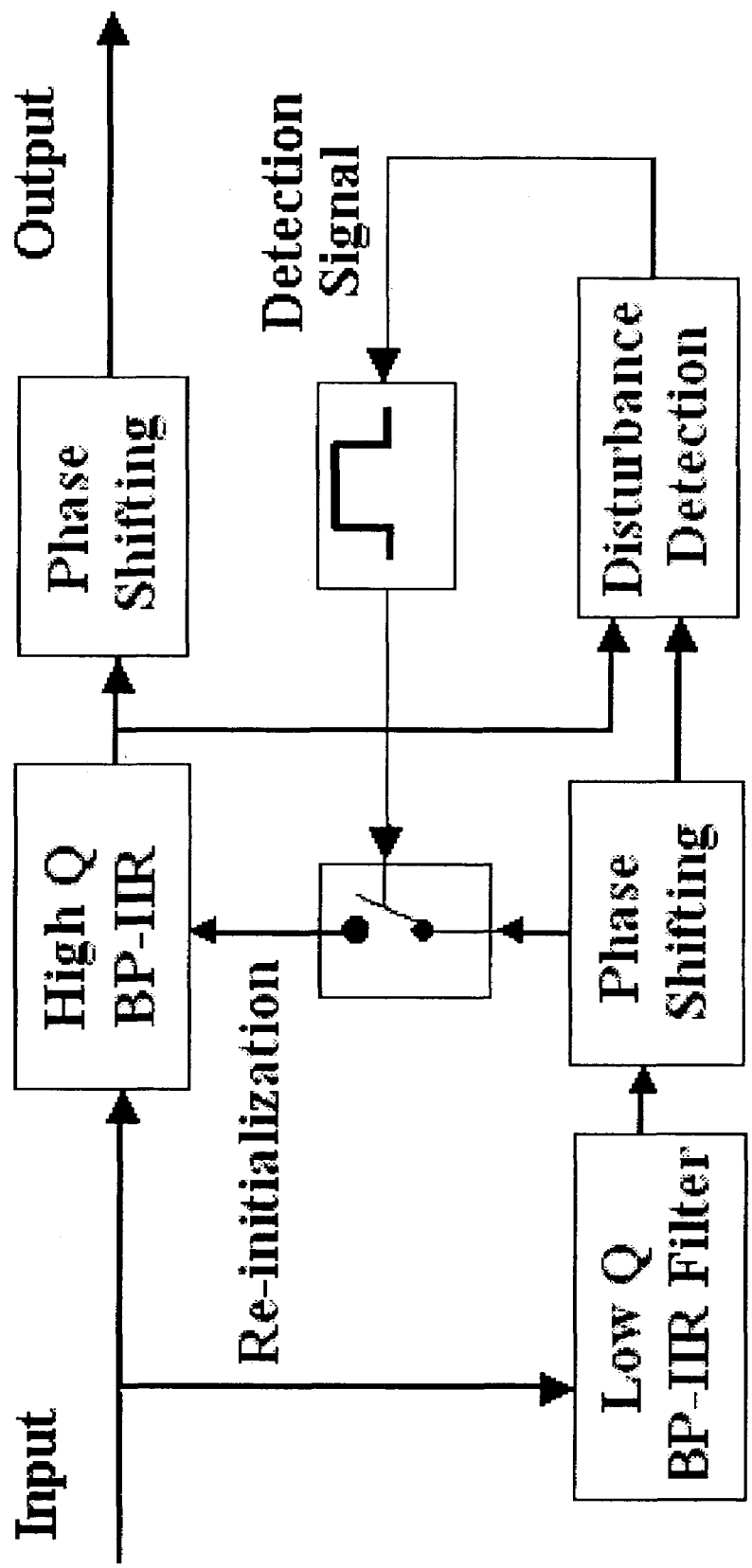
Figure 4 Re-initialization scheme using two IIR filters

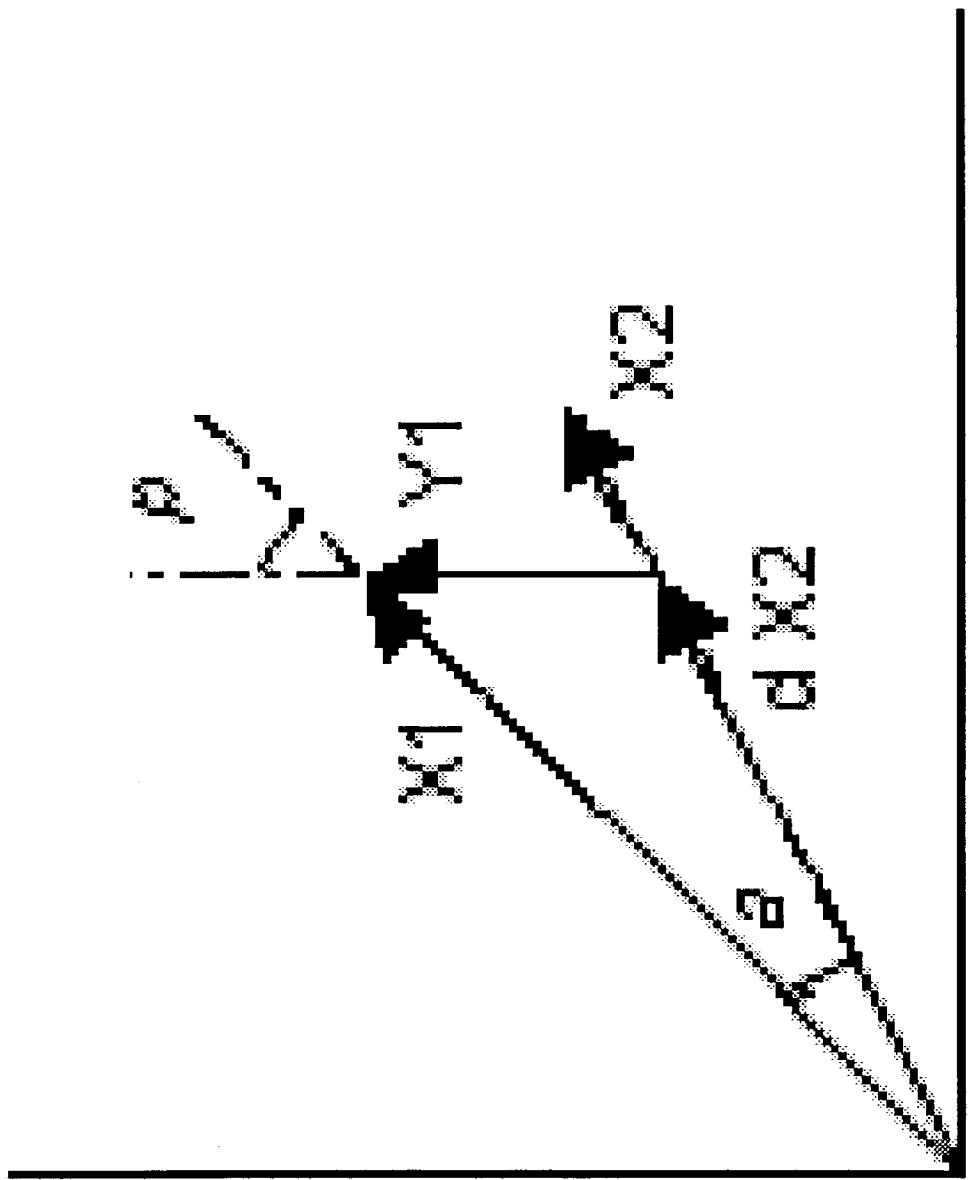
Figure 5 Phasor representation of the two-sample phase-shift algorithm

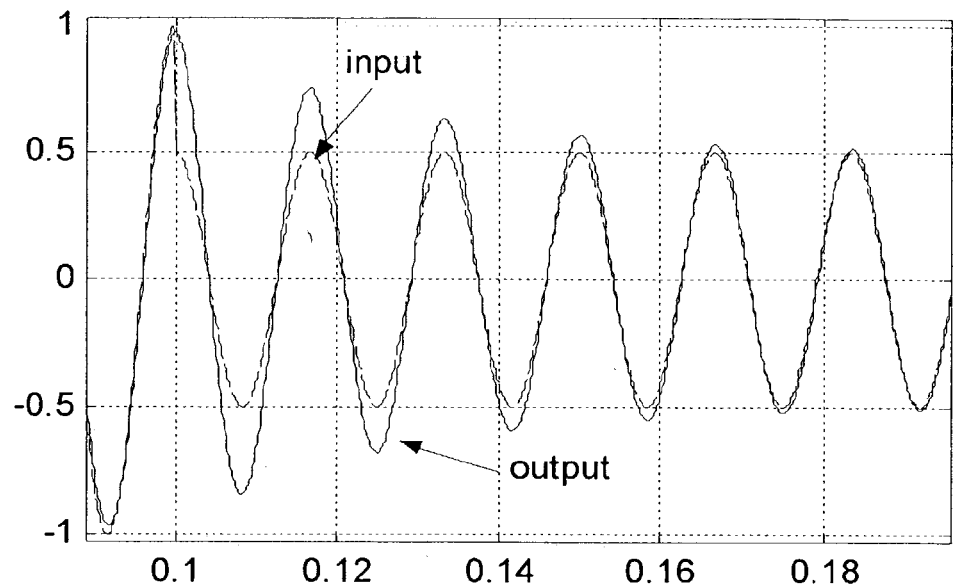
(a) without re-initialization
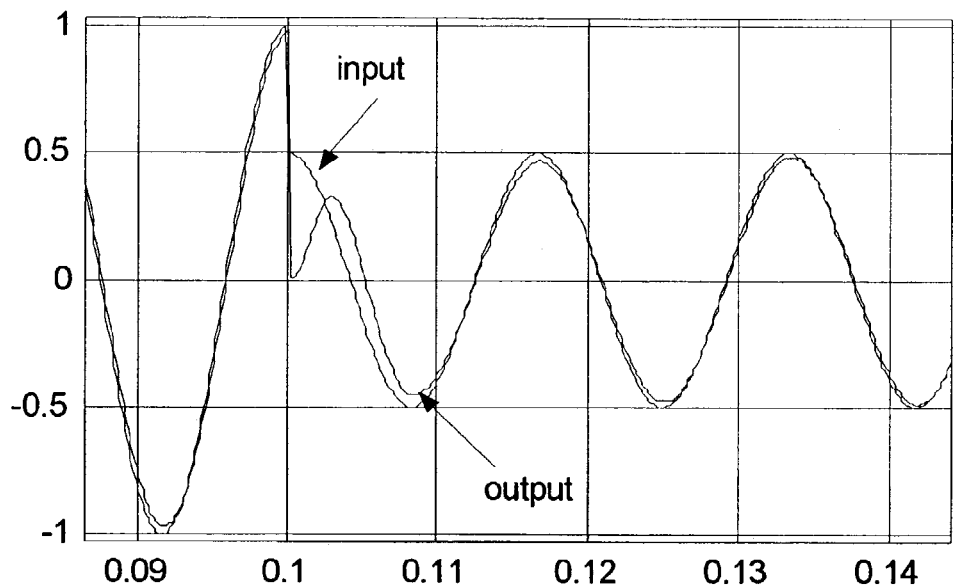
(b) with re-initialization
Figure 6 Time response of a high Q IIR filter with re-initialization

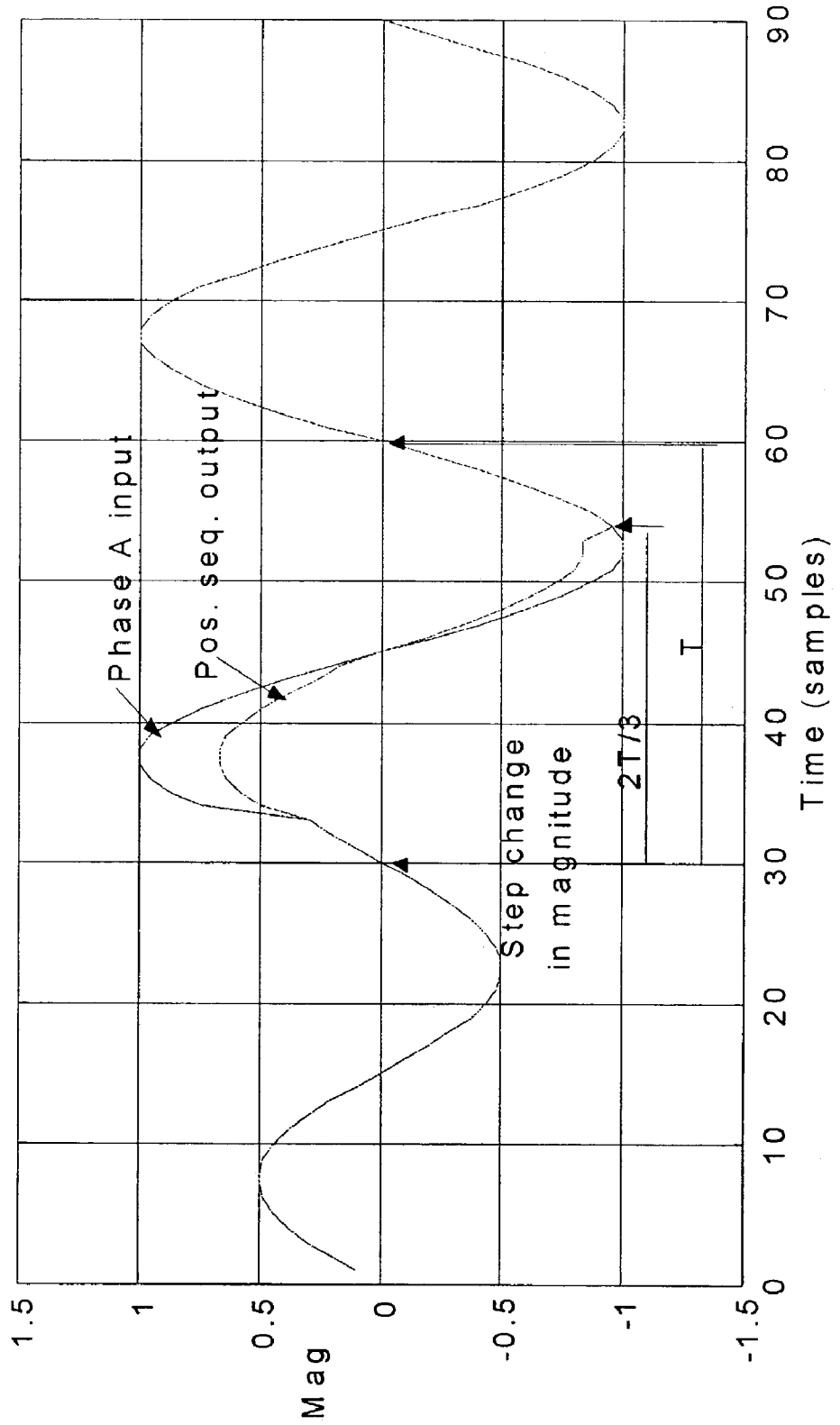
Figure 7. Positive sequence dynamic response to a step change in amplitude.

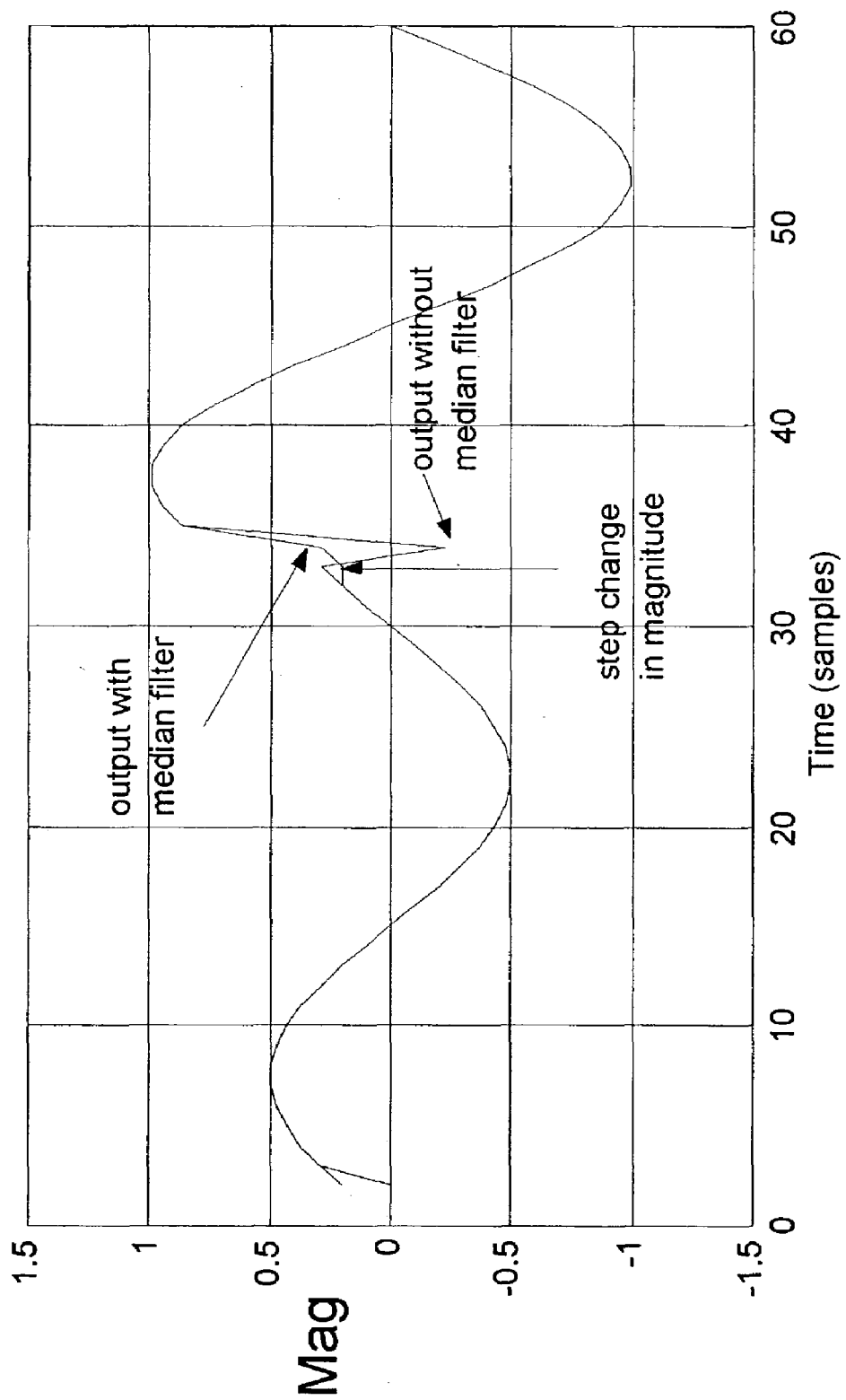
Figure 8. Positive sequence output with a median filter.

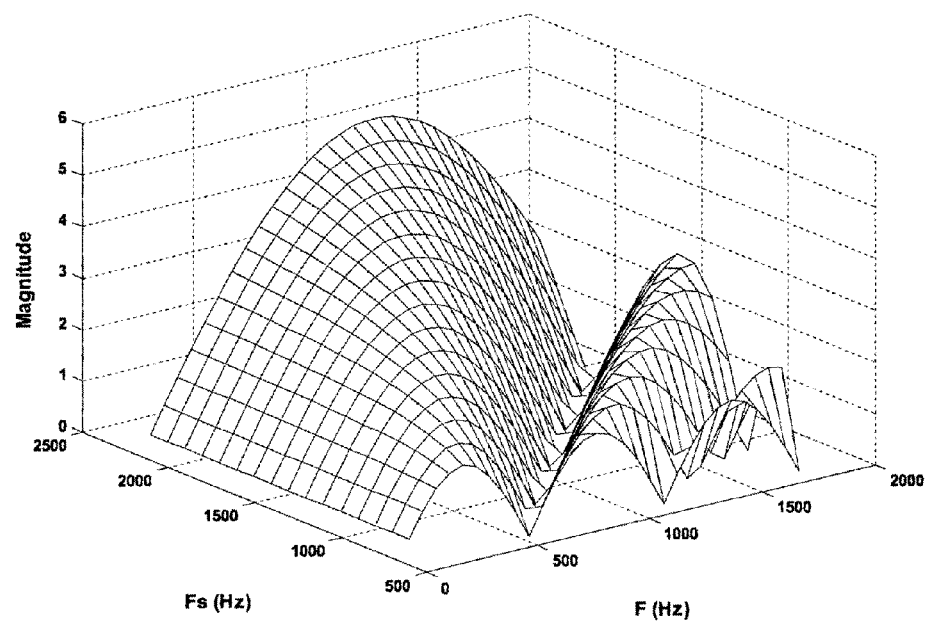
Figure 9. Frequency response of the positive sequence filter.

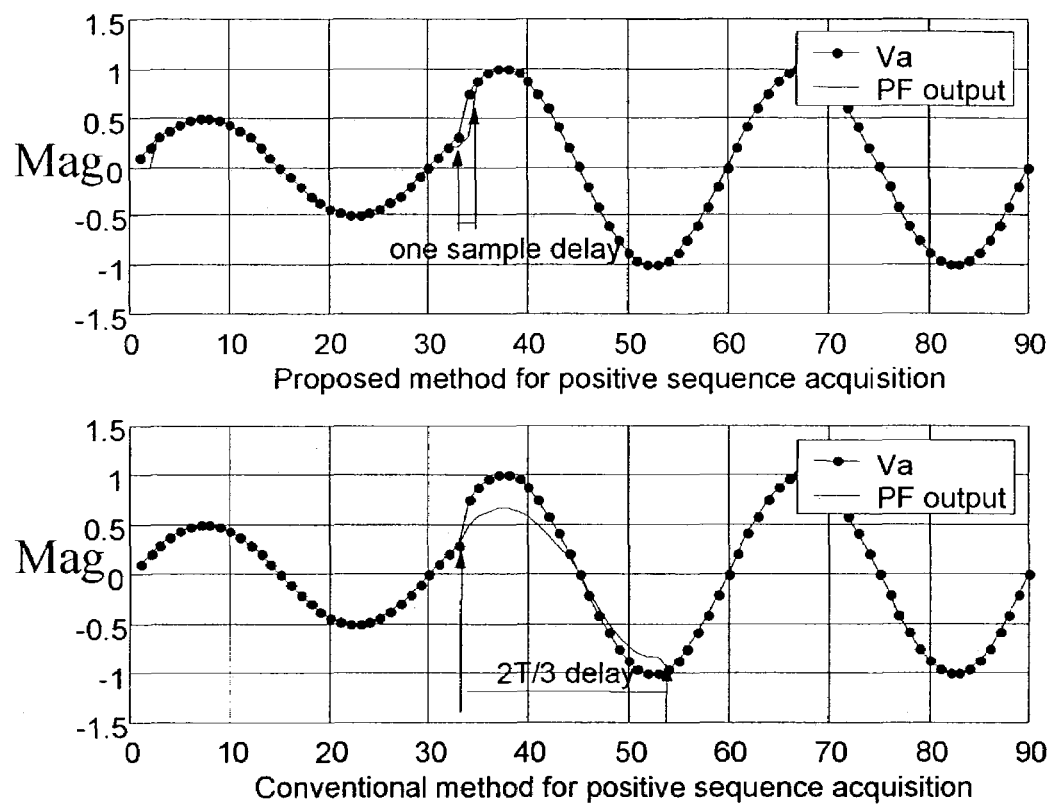
Figure 10. Comparison of two different positive sequence algorithms in the time domain.

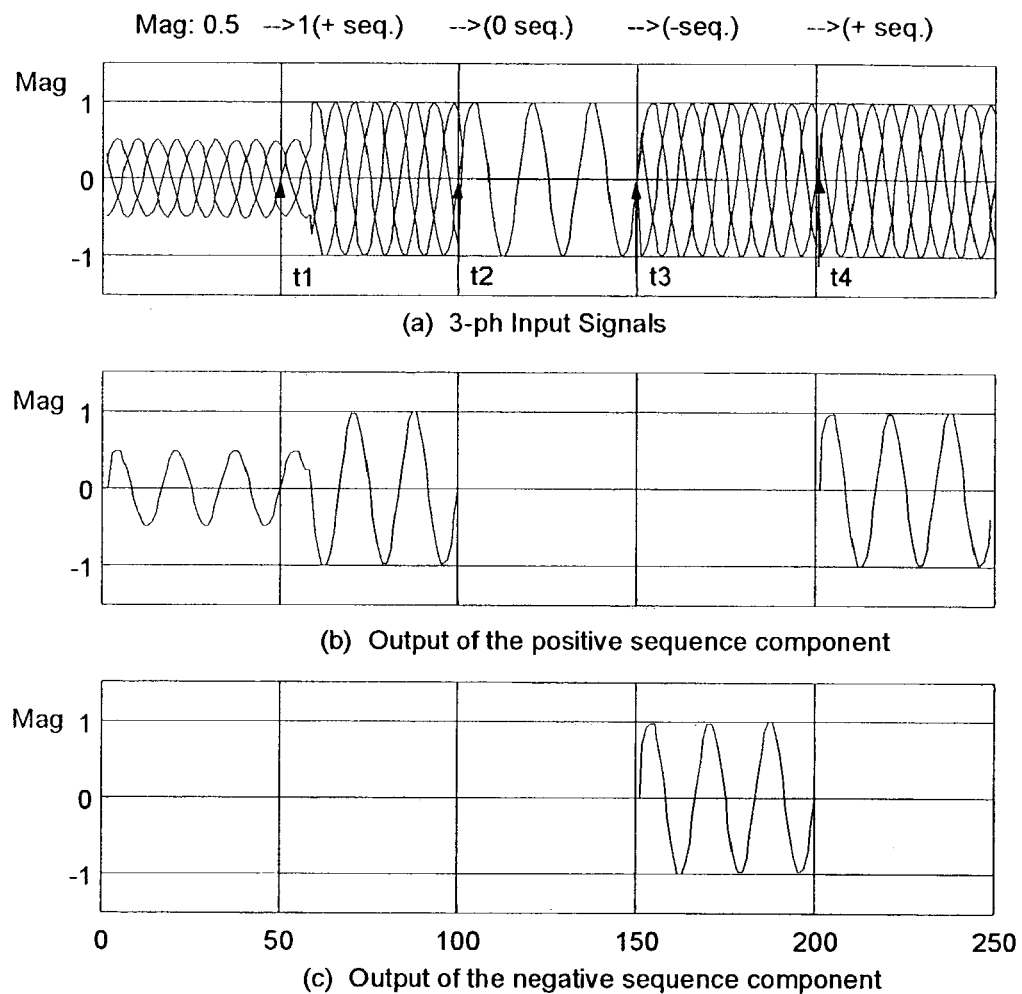
Figure 11. Output waveforms for different input signals.

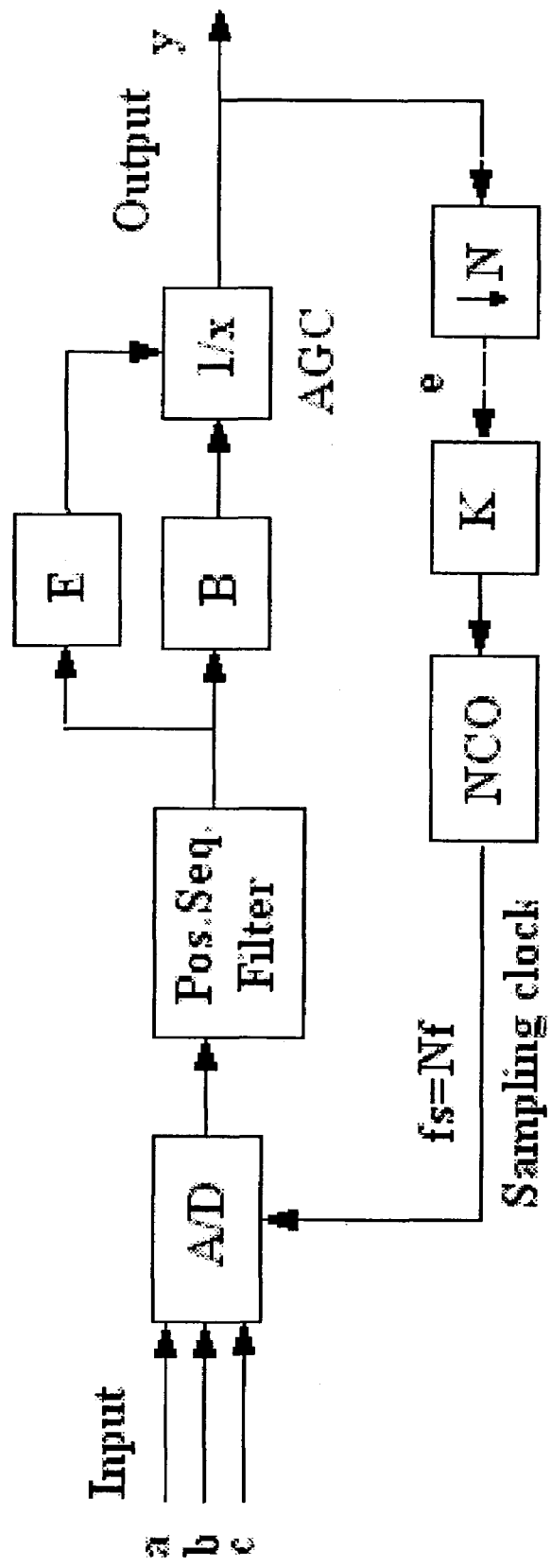
Figure 12. Diagram of the positive sequence extraction with a variable sampling multirate PLL.

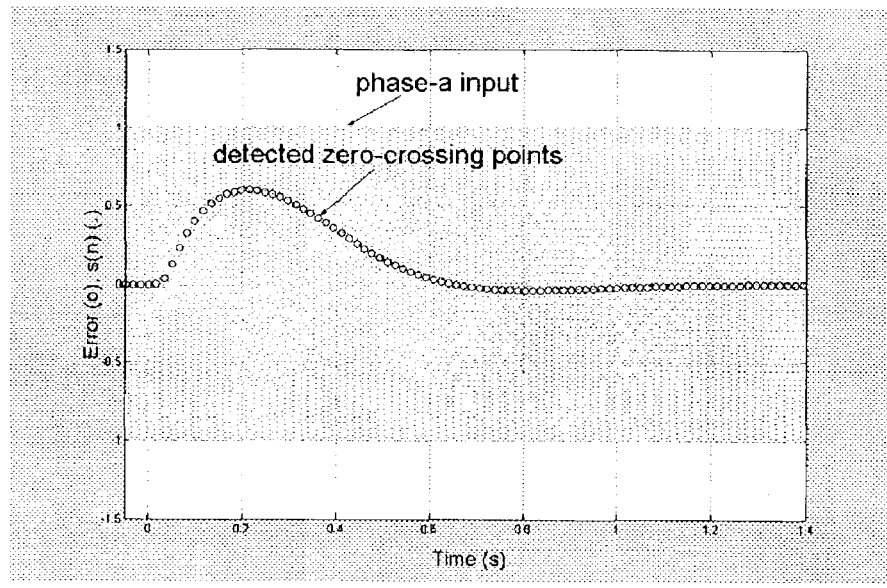
(a) Waveforms of input signal and error signal
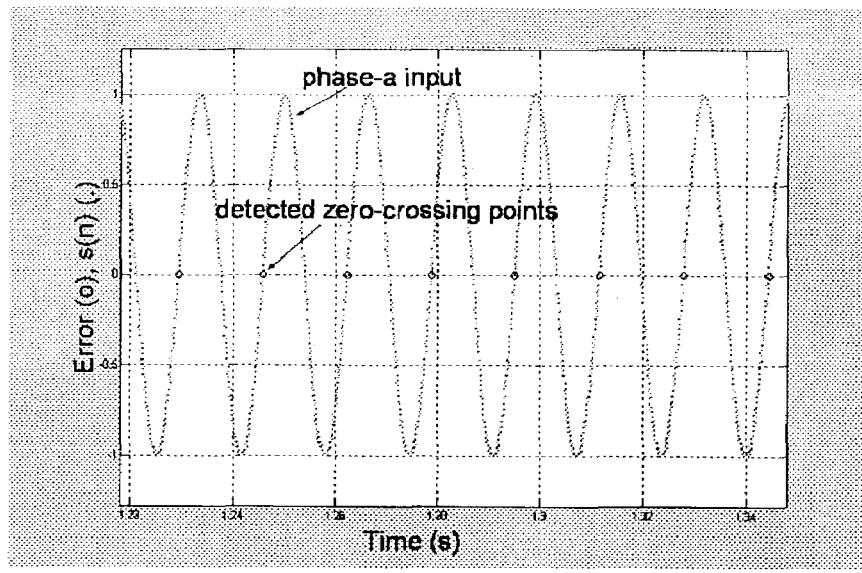
(b) Zoomed waveforms in new steady state
Figures 13(a) & 13(b). Time response of the positive sequence filter with PLL frequency tracking.

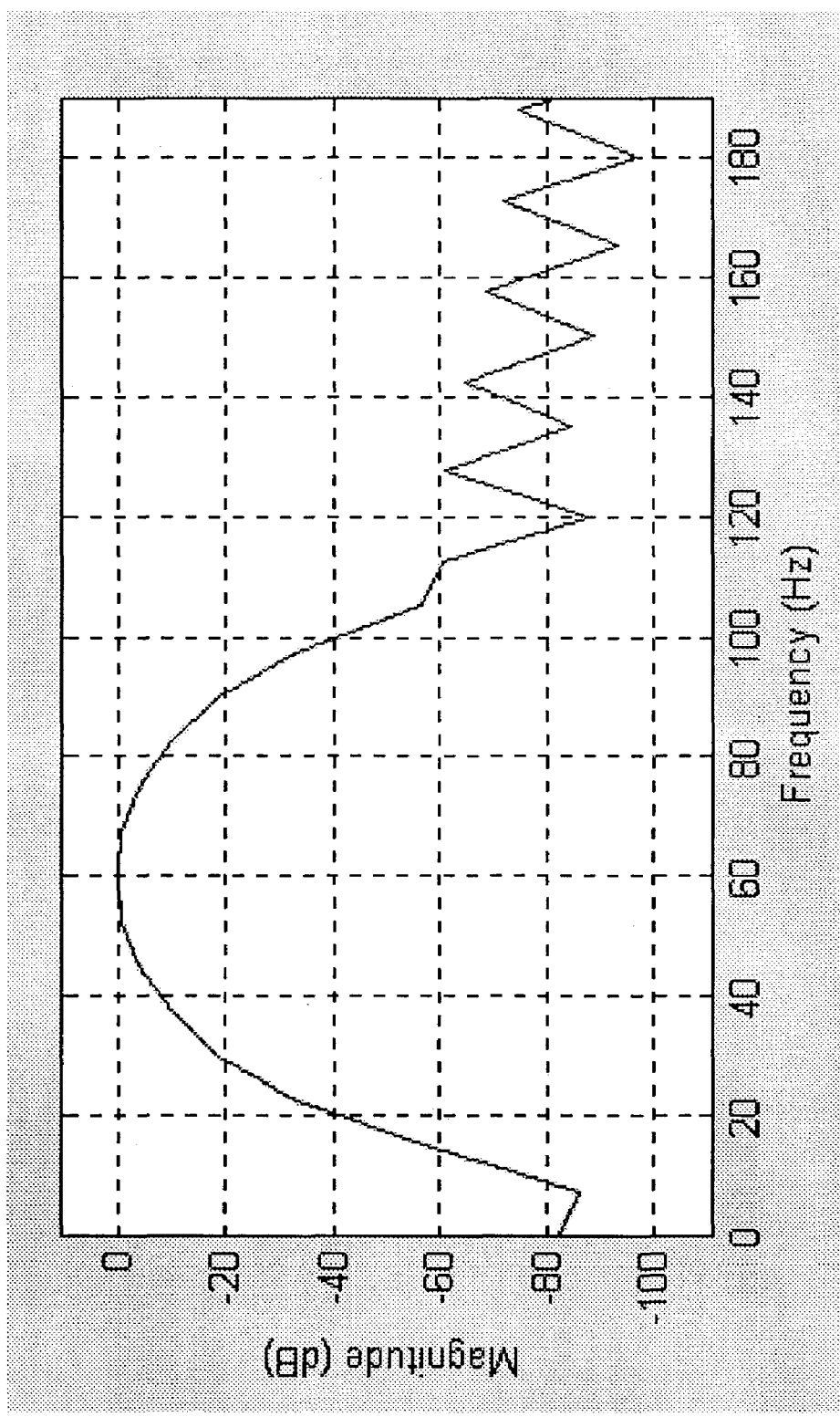
Figure 14. Frequency response of the filtered positive sequence filter with PLL frequency tracking.

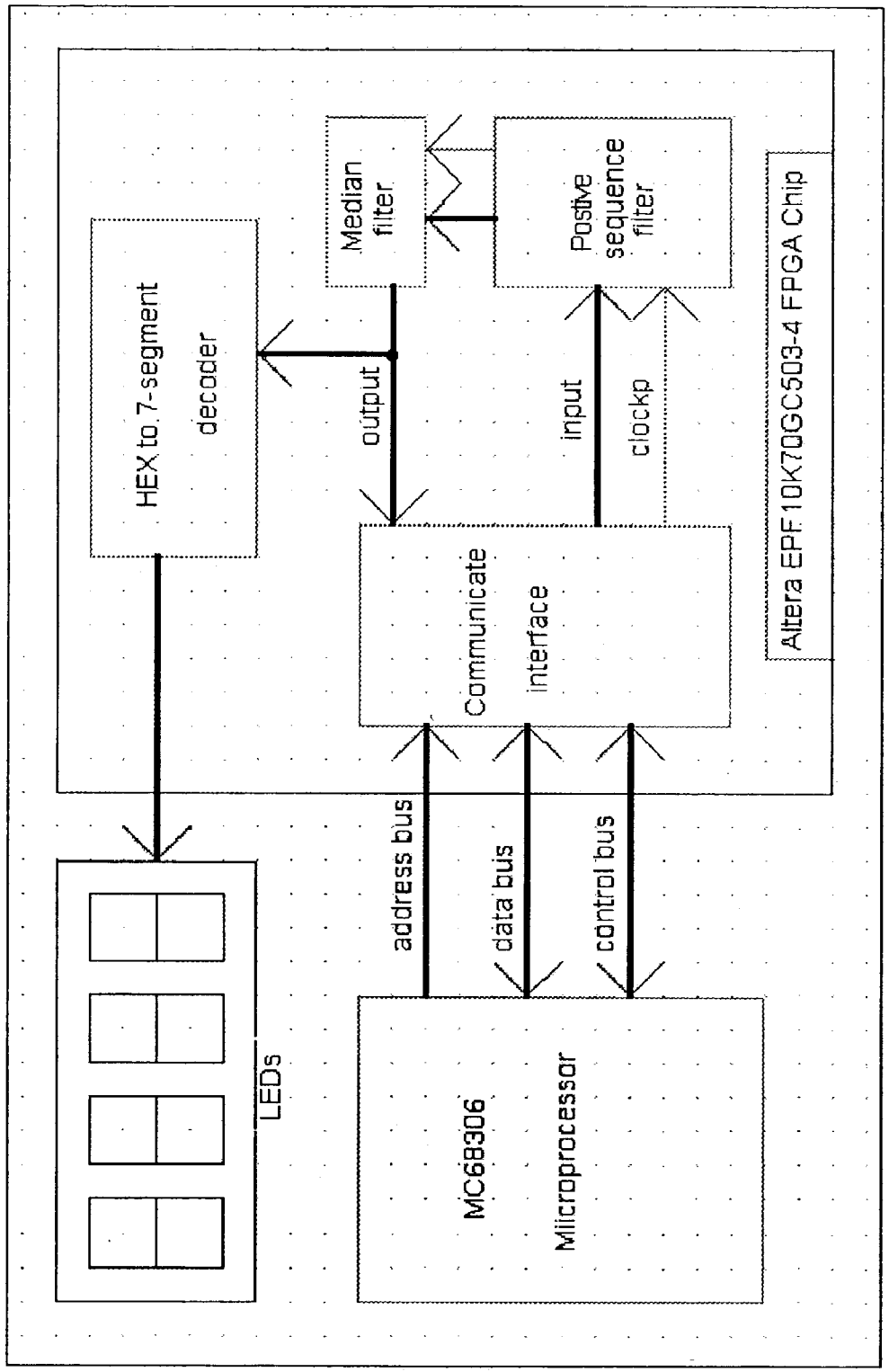
Figure 15. System prototyping on the Ultragizmo Board.

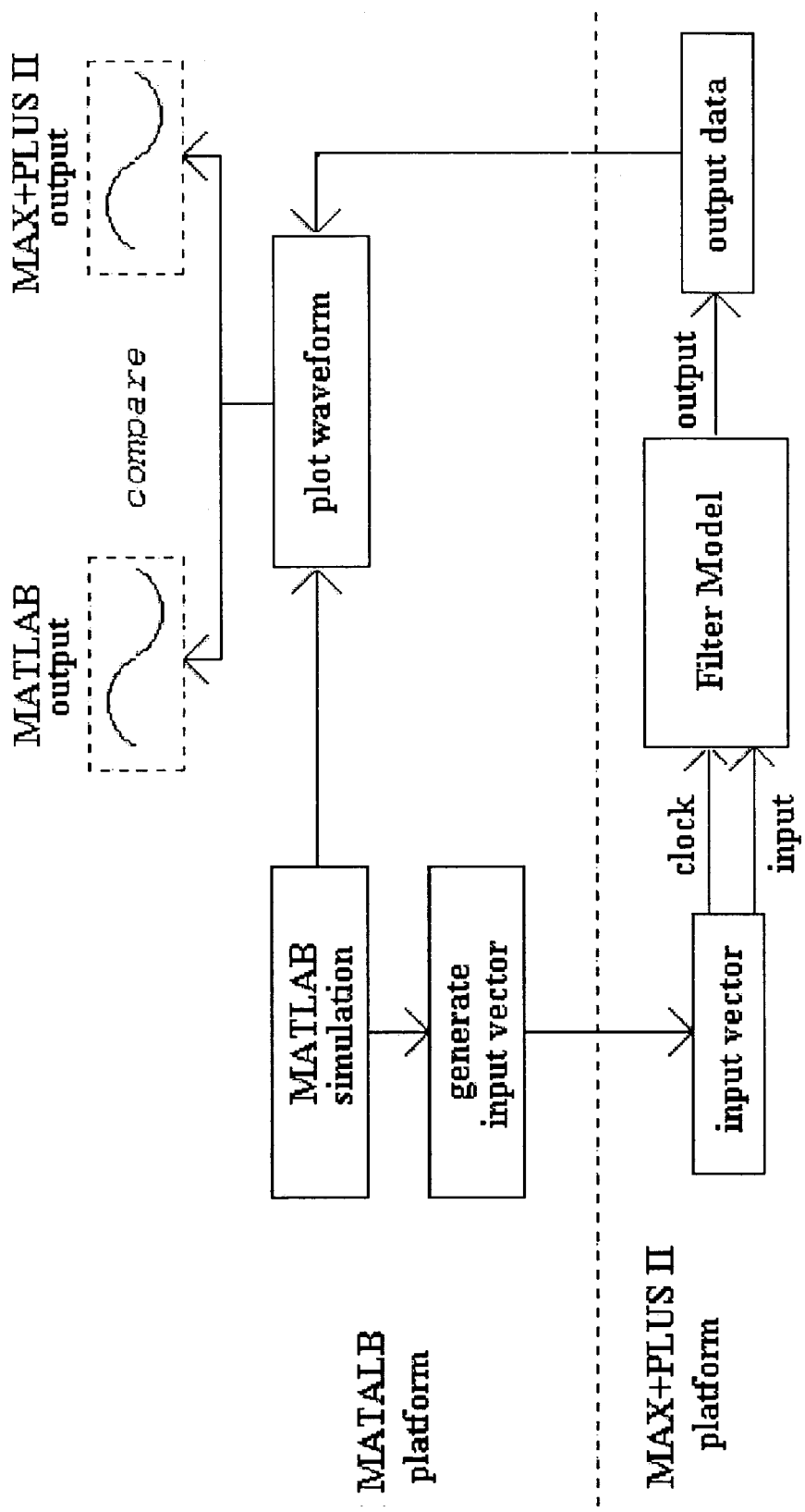
Figure 16. Architecture of testing scheme.

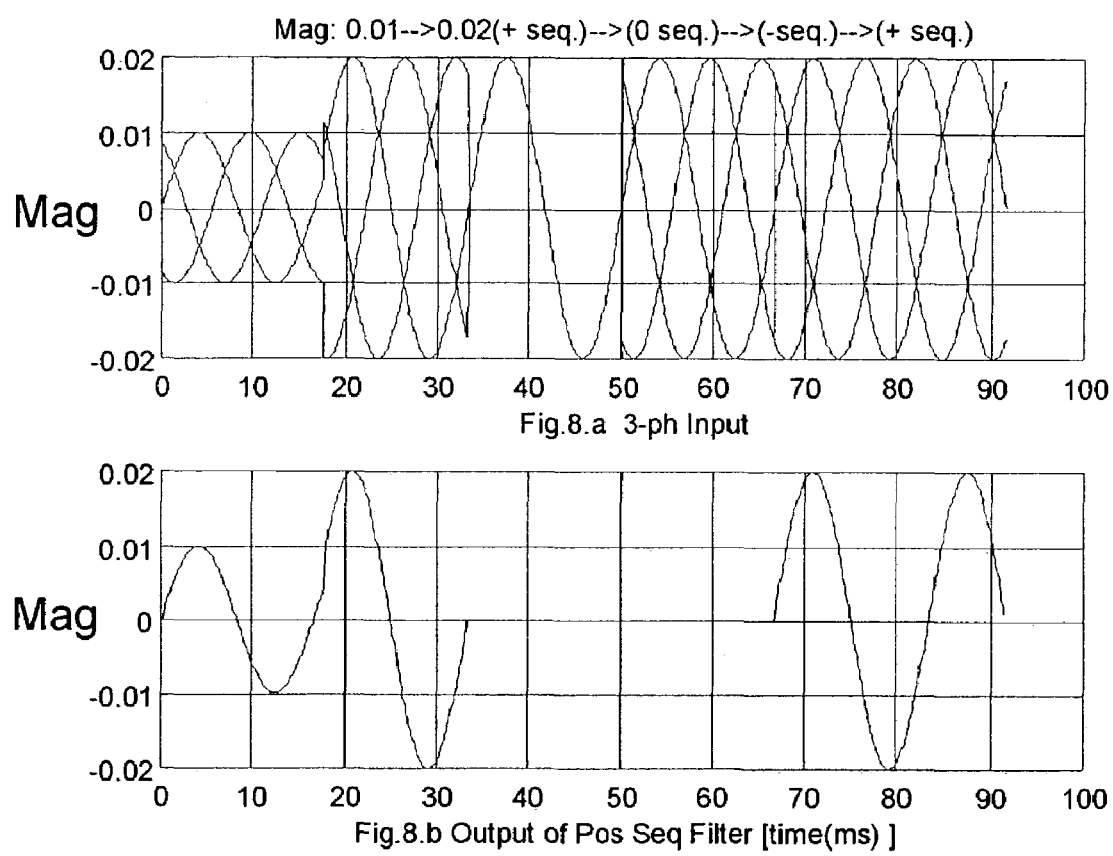
Figure 17. MATLAB simulation.

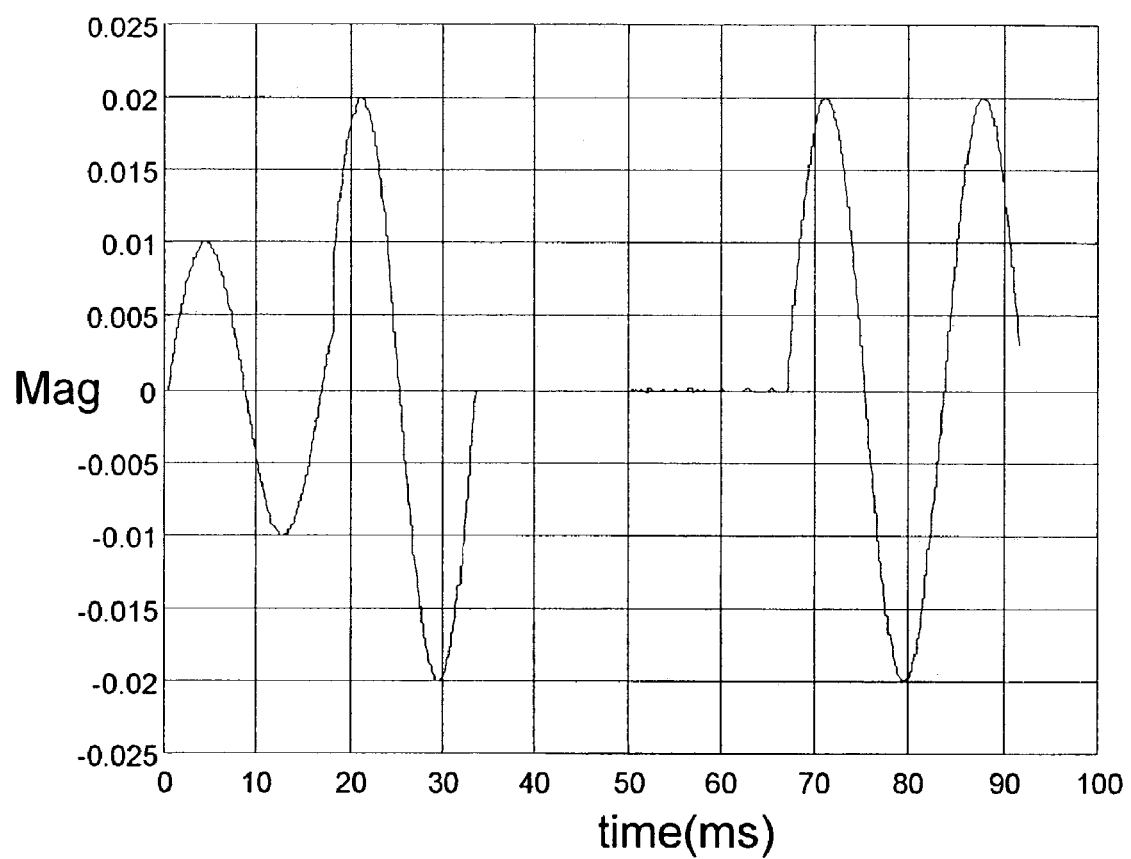
Figure 18. MAX+PLUS II simulation.

FAST PHASE SYNCHRONIZATION AND RETRIEVAL OF SEQUENCE COMPONENTS IN THREE-PHASE NETWORKS

CROSS REFERENCE TO RELATED APPLICATIONS

The present application is related to and claims the priority benefit of U.S. provisional application Nos. 60/369,937, filed Apr. 4, 2002, and 60/423,994, filed Nov. 6, 2002, each of which is incorporated herein by reference.

FIELD OF THE INVENTION

This invention relates to a method and system for fast retrieval of the sequence components of phase, frequency and amplitude varying signals and synchronization with these signals with a one cycle delay. More specifically, it relates to a method and system where the sequence components of a three-phase network power signal are digitally sampled at an integer multiple of the base frequency, monitored for faults and filtered in real time to acquire phase and amplitude, and for frequency synchronization. This invention also relates to an optimal architecture for a system on a chip that can address specific functionality requirements and economic directives.

BACKGROUND

The needs for fast sequence component retrieval and synchronization in power electronics and power engineering applications are numerous. Typical examples are: synchronization of inverters to an AC utility network, control of parallel connected inverters, synchronization of active filters, synchronization of line-commutated phase-controlled converters, synchronized signal processing, etc.

Sequence components are used in power systems and industrial applications to enable convenient examination and analysis of 3-phased power networks under both balanced and unbalanced operating conditions. Typical unbalances conditions are those caused by faults between the phases and/or ground, open phases and unbalanced loading such as static power equipment and single-phase devices.

The increasing use of static power devices has lead to many new applications of sequence components. For instance, in power conditioning equipment, the positive sequence component is needed for achieving a desired objective, e.g., unity power factor and constant output voltage, while the negative sequence component is required to compensate for current or voltage unbalance. The sequence components can be obtained through the use of a discrete transfer function.

The conventional symmetrical component method is used to extract sequence components where the base frequency is known a priori. Symmetrical components furnish significant insight into the behaviour of three-phase power networks and have been widely used in the fields of power system fault analysis and relaying protection. However, the use of the conventional method is inappropriate when the base frequency is not known a priori, which is generally the case. A partial solution to the problem involves continuously adapting the coefficients in the discrete transfer function. As the frequency changes, the coefficients are adapted and thus the discrete transfer function properties become frequency independent. This method, however, is computationally intensive. Furthermore, the time delay of two-thirds the period of the base signal caused by the traditional method has the disadvantage of causing delay and generating incorrect sequence components during input signal changes, because the data window spans the instant of signal change.

Another problem exists in obtaining reliable input signal data samples. When performing sequence extraction, the reliability of digital samples of a disturbed network signal can be limited by the performance of the digital bandpass filter. The predictive finite impulse response (FIR) and adaptive least mean square filtering approaches are widely used filtering techniques. Although these two types of filtering techniques are widely used in communications, motion control and power electronics, they still have some notable disadvantages. Predictive FIR filters require a high order for better harmonic attenuation resulting in a large look-up table for coefficients; generate considerable round-off noise; and are sensitive to component parameter variations. The techniques for determining FIR filter coefficients are also complex. The drawbacks of LMS adaptive filters include a long transient response, extreme sensitivity to step-size parameters, and computational complexity.

Despite the drawbacks of the FIR and LMS filters, these filters were traditionally preferred over Infinite Impulse Response filters due to the latter's long transient response at high attenuation and possible instability due to pole placement and finite arithmetic.

The increasing application of nonlinear loads and devices in power systems has resulted in an increase in harmonics and disturbances in voltages and currents. This distortion causes several problems for metering, control and protective devices. Such problems include measurement errors, control system instability or relay misoperation. Metering, control and protective devices are basically designed to operate with fundamental sinusoidal components. Therefore, various filtering techniques are required to eliminate undesired frequencies. Traditional filters usually cause phase shift between the input signals and the output signals. This is problematic for power converters, where clear sinusoidal reference signals without phase shifting are required for synchronization or zero-crossing detection purposes.

From a power engineering or industrial electronics user perspective, there is a clear need for a signal-processing unit that can meet or be adapted to meet the following specifications:

Line frequency adaptation
Zero phase error between input and output signal under steady state conditions
Immunity to harmonic and aperiodic disturbances
Fast response to changes in the fundamental component in the presence of harmonic and aperiodic disturbances
Fast detection of a fault and or disturbance condition From a producer's perspective a suitable design should take the customer's functionality requirements into account subject to the additional constraint that the cost be acceptable. Cost is defined broadly to include product, training and integration costs. Directives that are conducive to lower costs include:

Small footprint area
Reduction of variable programming parameters
Appropriate partitioning of blocks that leads to a small number of blocks while retaining application flexibility
Reduction of analog trimming components

SUMMARY OF THE INVENTION

This invention discloses a fully digital means of obtaining the sequence components of a power signal in the presence of phase, amplitude or frequency variation. It also discloses a phase matched filtering fault detection scheme that co-operates with the sequence component extraction method. The entire system can be unified in a single device employing a multirate phase-locked loop (multirate PLL), which provides the phase synchronization and frequency adaptive sampling necessary for frequency adaptive sequence component extraction and robust infinite impulse response (IIR) filtering. The directives indicated above can be addressed by our fully digital solution, fully integrated on one chip.

It is an object of this invention to provide fast retrieval of the sequence components of a three phase power signal using frequency adaptive digital sampling.

It is an object of this invention to provide fast disturbance and fault detection of an otherwise noisy signal, using a pair of IIR filters with different transient response characteristics.

It is a further object of this invention to implement the sequence component and fault detection schemes in a single digital device that obtains its sample sequence using a multirate phase-locked loop.

Synchronized sampling signals are generated and are a multiple of the base frequency. The discrete transfer function coefficients are fixed and the sampling frequency is proportional to the base frequency.

The invention represents a new technique that allows rapid acquisition of sequence components. To avoid the impacts of input frequency variations and harmonics, a variable sampling multirate phase-locked loop with an anti-aliasing filter is combined with the new sequence extraction algorithm. The generated sampling frequency is proportional to the base frequency of the input signal. Consequently, the system is synchronously controlled.

The system and method defines a new microprocessor based algorithm for fast retrieval of the current and voltage sequence components in a three-phase network. The one-sample delay algorithm can operate at an arbitrary sampling frequency and executes with minimal computational burden. A three-point median filter is utilized to remove the impulse noise generated by the algorithm during the transient process. The positive sequence extraction is then integrated into a variable sampling multi-rate phase-locked loop to realize frequency adaptation and harmonic attenuation simultaneously. Simulations show that an optimal transient performance can be achieved using the proposed technique under both balanced and unbalanced situations.

The present invention helps to overcome the long transient response and pole instability of the IIR filters in a new and efficient way. Two second order IIR filters are used in parallel to create a filter with a relatively fast transient response and relatively stable poles so as to take advantage of the vast reduction in computational complexity of IIR filters as compared to other digital filters. One filter is a higher stopband attenuation slower transient response bandpass infinite impulse response filter (also called a "high Q bandpass IIR filter") and the second filter is a lower stopband attenuation faster transient response bandpass infinite impulse response filter (also called a "low Q bandpass IIR filter"). In the presence of a disturbance, the values held in the state registers of the low Q bandpass IIR filter are more accurate approximations of the true signal, and so they are transferred to the state registers of the high Q bandpass IIR filter thereby improving response time without a noticeable reduction of stopband attenuation.

The invention also helps resolve the phase matching problem for IIR filters. The resulting functional block can be described in general terms as a 360 degree phase-shift dual IIR filter with fault detection and re-initialization.

Design of the dual IIR filter with fault detection and re-initialization relates the invention more specifically to the power engineering and industrial electronics environment, and this is a preferred embodiment of the invention. However, this should not limit the usefulness or applicability of the invention to any sampled signal, for instance in communications, aerospace and transportation.

DETAILED DESCRIPTION

FIG. 1 is a schematic of the most preferred embodiment of the invention. Region A of FIG. 1, delineated by the dashed line, shows a preferred embodiment of the dual IIR filter with fault detection and re-initialization. When implemented in a three phase network sequence component extraction device, one dual IIR filter with fault detection and re-initialization must be used for each sequence component stream labelled +, −, o.

FIG. 2 is a schematic of the direct realization of a second order IIR filter, where the fixed coefficients $a_1$, $a_2$, $b_1$ and $b_2$ determine the center frequency, phase delay and quality factor of the filter. The selection of appropriate coefficients to ensure design parameters are met is discussed below.

FIG. 3 is a graphical representation of the frequency response of two bandpass IIR filters, with identical center frequencies of 60 Hz, but with different quality factors (Q=0.9 vs. Q=0.95). As Q approaches 1, the ability of the filter to reject undesirable frequencies is increased.

FIG. 4 is a schematic showing how and when the High Q bandpass IIR filter state variables are changed to reflect those of the Low Q bandpass IIR filter state variables.

FIG. 5 is the phasor representation of the two-sample phase-shift algorithm discussed in more detail below.

FIG. 6 is a comparison between of the response times to a step decrease in the input signal of (a) High Q bandpass IIR filter without re-initialization, and (b) the same High Q bandpass IIR filter with state-variable re-initialization.

FIG. 7 is a graph showing the response of the conventional symmetrical component method to a step change in amplitude of the positive component of the power network input signal.

FIG. 8 is a graph showing the benefit of using a 3-point median filter to smooth data collection before sequence component extraction occurs.

FIG. 9 is a graph showing the lowpass frequency response characteristic of the positive sequence filter used in the preferred embodiment.

FIG. 10 is a graphical comparison of two different positive sequence algorithms in the time domain.

FIG. 11. Output waveforms for different input signals.

FIG. 12 is a block diagram showing the position of the positive sequence extraction filter implemented as part of a variable sampling multirate PLL.

FIGS. 13(a) & 13(b) are graphs showing the time response of the variable sampling multirate PLL with positive sequence filter after a step change in frequency during the transient period (FIG. 13(a)) and in the steady-state (FIG. 13(b)).

FIG. 14. is a graph showing the frequency response of the entire variable sampling multirate PLL with positive sequence filter, where the center frequency is 60 Hz and the bandpass filter is a Blackman window finite impulse response filter of order 512.

FIG. 15 is a schematic of the entire sequence component extraction system implemented on the University of Toronto Ultragizmo™ Board.

FIG. 16 is a diagram showing the Architecture of the testing scheme.

FIG. 17 is a graph showing a disturbed three phase signal (a) and the response of the positive sequence filter to detecting the faults implemented as a MATLAB™ simulation.

FIG. 18 is a graph showing the positive sequence filter response of a MAX+PLUS II™ simulation to the same input shown in FIG. 17(a).

GENERAL DESCRIPTION OF PREFERRED EMBODIMENTS

The invention is disclosed in two parts. The multirate PLL with robust digital IIR filtering and fault detection form the first part. The implementation of a fast sequence component extraction method to three-phase network sequence components forms the second part. The implementation of parts 1 and 2 in a single digital system where the samples are provided by a multirate sampling zero crossing phase-locked loop, whose sampling instants are triggered off a single clock, forms the most preferred embodiment.

Part 1

The present invention addresses the long transient response normally associated with second order IIR filters by using two IIR filters in parallel. Two bandpass IIR filters operate on the sequence components of a power signal. The first filter, a relatively high quality factor bandpass IIR filter with relatively good noise attenuation but relatively slow response, smoothes the input signal. The output of the second filter, a relatively low quality factor bandpass IIR filter with relatively poor noise attenuation but relatively fast response, is compared to the first signal to detect disturbances. When a disturbance is detected, the relevant prior filter outputs of the second filter (the state register of that IIR filter) are used to re-initialize the state register of the first filter to improve the system's dynamic response. The result is a dual IIR filter with both good noise attenuation and fast response to disturbances.

To achieve the design objectives of the system, each of the filters must be tuned to create a 360 degree phase shift with respect to the base frequency ($F_b$) of the input power signal. Furthermore, since each of the filters takes its sampling frequency from a phase locked loop tracking the underlying base frequency signal, the filter coefficients are permanently set and therefore the amount of gates used in the implementation can be minimized.

The following analysis derives the coefficient selection equations for 360 degree phase shift filtering. The derivation uses a general second-order filter because any higher order IIR filters can be obtained by cascading second order filters. The transfer function of the IIR filter is $$H(z) = A \prod_{k=1}^{K} \frac{1 + b_{1k}z^{-1} + b_{2k}z^{-2}}{1 + a_{1k}z^{-1} + a_{2k}z^{-2}} \quad (1)$$

Poles determine the passband and zeros decide the stopband or the attenuation level of the harmonics. Poles and zeros may be either complex or real. Consider a second order filter with the following transfer function $$H(z) = G \cdot \frac{1 - dz^{-1}}{1 + a_1 z^{-1} + a_2 z^{-2}} \quad (2)$$

The filter consists of a complex conjugate pole pair and a real zero. In order to design the filter with no phase shift at the fundamental frequency, we split H(z) into two parts, i.e.

$$H(z) = H_1(z) \cdot H_2(z) = G \cdot \frac{1 - dz^{-1}}{1 + a_1 z^{-1} + a_2 z^{-2}} \quad (3)$$

where $H_1(z) = \frac{G}{1 + a_1 z^{-1} + a_2 z^{-2}}$ and $H_2(z) = 1 - d \cdot z^{-1}$.

In equation (3), $H_1(z)$ is an all-pole IIR filter with a pair of complex conjugate poles and $H_2(z)$, which is related to the real zero at 0 Hz and eliminates the DC component, is considered as a phase shifter. Selectivity of the filter depends on the pole radius of $H_1(z)$. $H_2(z)$ can compensate for the phase shift caused by $H_1(z)$. Then the overall frequency characteristic will be bandpass and the phase shift at the center frequency will be 360 degrees, i.e., zero phase shift error filtering for the fundamental sinusoidal input signal when the system is in steady-state.

The combination of $H_1(z)$ and $H_2(z)$ can achieve the desired bandpass characteristics. To realize zero phase shift at the base frequency for the filter H(z), the designer can proceed as follows.

For the stability of the filter, poles must be within the unit circle in the z-plane. We put the poles at the position related to the fundamental frequency to achieve a maximally amplified base frequency component and the maximum attenuation of harmonics. Then $$H_1(z) = \frac{1}{1 + a_1 z^{-1} + a_2 z^{-2}} \quad (4)$$

$$= \frac{1}{(1 - cz^{-1})(1 - c^* z^{-1})}$$

$$= \frac{1}{(1 - p \cdot e^{j\omega T_s} z^{-1})(1 - p \cdot e^{-j\omega T_s} z^{-1})}$$

$$= \frac{1}{1 - 2p \cdot \cos\left(2\pi \frac{F_b}{F_s}\right) \cdot z^{-1} + p^2 z^{-2}}$$

where $F_b$ is the base frequency, $F_s$ is the sampling frequency and p is the pole radius.

The filter coefficients in (4) are $$a_1 = 2p \cdot \cos\left(2\pi \frac{F_b}{F_s}\right) \text{ and } a_2 = p^2.$$

The pole radius p determines the effectiveness of the filter in attenuating harmonics. When p approaches 1, the output at the base frequency will become larger. FIG. 3 shows the frequency characteristic of the filter and how p affects the magnitude response. At high Qs (large p), the filter has better bandpass features.

Beginning with an analysis in the phasor plane shown in FIG. 5, the transfer function is derived as follows. Assume that phasor $X_1$ represents an arbitrary sinusoidal signal. Consider another signal $X_2$ with a phase shift $-\alpha$, $X_2=X_1\angle-\alpha$. From FIG. 5, we have $$Y_1 = X_1 - d \cdot X_2 = X_1 - d \cdot X_1 \angle \alpha \tag{5}$$

where d is a constant. FIG. 5 shows that phasor $Y_1$ has a phase shift $\rho$ with respect to phasor $X_1$ but with a different magnitude. $\rho$ can take on any value if $\alpha$ and d are selected properly.

According to the Sine Rule, $$\frac{A}{\sin\alpha} = \frac{B}{\sin\beta} = \frac{C}{\sin\gamma}$$

is true for an arbitrary triangle. The constant d can be derived as follows, $$d = \frac{\sin\alpha}{\sin(\alpha+\rho)} \tag{6}$$

In the time domain, equation (5) has the following expression, $$y_1(k) = x_1(t) - d \cdot x_1\left(t - \frac{\alpha}{\omega}\right) \tag{7}$$

Sampling at frequency $F_s$ and choosing $\alpha = 2\pi F_b/F_s$, results in a $\alpha/\omega = 1/T_s$. Equation (7) can be represented in discrete form by $$y_1(k) = x_1(k) - d \cdot x_1(k-1) \tag{8}$$

This expression indicates that any phase shifting can be achieved by using only two samples.

In the z-plane, $$y_1(z) = (1 - d \cdot z^{-1}) x_1(z) \tag{9}$$

The transfer function of the phase shifter is $$H_1(z) = (1 - d \cdot z^{-1}) \tag{10}$$

i.e. a zero exsists at 0 Hz and has the same form as the expression in equation (2).

To design a system with a specific phase shift, assume a sampling frequency $F_s$, where $$\alpha = 2\pi \frac{F_b}{F_s}$$

is the angle related to one sample for the base frequency $F_b$. Parameters in equation (3) are then determined by the following procedures:

(1) Amplitude characteristic
   a. Select the pole radius p according to Signal to Noise Ratio (SNR) specifications b. Let $a_1 = 2p \cdot \cos\alpha$, $a_2 = -p^2$ \qquad(11)

This results in the complex conjugate poles being at the base frequency.

(2) Phase characteristic
   a. Phase shift caused by the poles is $$\beta = \text{Arg}(H_1(e^{j\alpha})) \tag{12}$$

b. Let $d = \dfrac{\sin\alpha}{\sin(\alpha+\beta)}$ \qquad(13)

(3) Select G to keep the filter gain at the base frequency unchanged

As an example, choosing $F_s=128 \cdot F_b$, p=0.95 results in $$H(z) = 0.053 \cdot \frac{1 - 0.9732 z^{-1}}{1 + 1.8977 z^{-1} - 0.9025 z^{-2}} \tag{14}$$

In general, the sampling rate, $F_s$, can be any integer multiple of the base frequency, $F_b$. In practise, the number choosen is of the form $2^n$.

The ideal bandpass characteristic is realized with a center frequency positioned at the base frequency (60 Hz) and no phase shift at this frequency.

In some applications, there are usually one or two dominant harmonic components, such as the second or third harmonics, which must be attenuated. In these applications, additional complex conjugate zeros can be used to eliminate these components, and the transfer function is modified to $$H(z) = G \cdot \frac{(1 - d z^{-1}) \cdot (1 + b_1 z^{-1} + b_2 z^{-2})}{1 + a_1 z^{-1} + a_2 z^{-2}} \tag{15}$$

$$= H_1(z) \cdot H_2(z) \cdot H_3(z)$$

thus $$H_3(z) = 1 + b_1 z^{-1} + b_2 z^{-2} = 1 - 2p \cdot \cos\left(2\pi \cdot \frac{F_b}{F_s} \cdot k\right) + z^{-2}, \tag{16}$$

where $$b_1 = -2p \cdot \cos\left(2\pi \cdot \frac{F_b}{F_s} \cdot k\right)$$

and $b_2=1$. In this case, the compensation phase will also take the phase shift caused by the complex zeros into account.

Combining IIR Filters

The formulas above allow the design of an IIR filter that meets attenuation specifications with 360 degree phase shift (i.e. zero phase error). However, to avoid the problems of long transient error delays, a second IIR filter with a lower quality factor for fast transient response can be designed with zero phase error. These two filters can be combined as shown in FIG. 4, so that a comparison of the filter outputs reveals when a fault (change in the steady state) has occurred. The filtered output of the second low quality factor IIR filter can be used to re-initialize the state space vector of the first high quality IIR filter to limit transient delay. The advantage of this method can be readily seen in FIG. 6, where a step change (fault/disturbance) in the amplitude of the input signal produces a much longer transient response when there is no re-initialization of the state variables once the fault is detected.

Part 2

The above invention can be further adapted to the situation of three-phase networks using a combined system according to the method described below.

Unbalanced voltages or currents can be determined from the sequence components using the following set of equations:

$$V_a = V_+ + V_- + V_0$$
$$V_b = \lambda^2 V_+ + \lambda V_- + V_0 \quad (17)$$
$$V_c = \lambda V_+ + \lambda^2 V_- + V_0$$

where $\lambda = e^{j120°}$; $V_a$, $V_b$, and $V_c$ are the three phase unbalanced line to neutral phasors; $V_+$, $V_-$ and $V_0$ are positive, negative and zero sequence component phasors.

From equation (17), the following sequence quantities for a three-phase unbalanced system can be determined, $$3V_+ = V_a + \lambda V_b + \lambda^2 V_c \quad 18(a)$$
$$3V_- = V_a + \lambda^2 V_b + \lambda V_c \quad 18(b)$$
$$3V_0 = V_a + V_b + V_c \quad 18(c) \ (18)$$

Sequence component extraction can be implemented with equation (18a), (18b) and (18c). The subsequent discussions focus only on the retrieval of the positive sequence component. The principle henceforth described is also applicable to the retrieval of the negative sequence or zero sequence components.

On a complex plane, $$e^{j120°} = e^{-j240°}$$
$$e^{j240°} = e^{-j120°}$$

Therefore, formula (18a) becomes $$3V_+ = V_a + e^{-j240°} V_b + e^{-j120°} V_c \quad (19)$$

Since a $-360°$ phase shift is equivalent to a period delay in the time domain, equation (19) may be written as:

$$3V_+(t) = V_a(t) + V_b\left(t - \frac{2T_n}{3}\right) + V_c\left(t - \frac{T_n}{3}\right) \quad (20)$$

where $T_n$ is the fundamental frequency period.

The transient output is not correct during the $\frac{2}{3}$ period time delay in the positive sequence output (FIG. 7). In the case of time critical applications, this response is too slow. The conventional symmetrical components technique has the disadvantage of causing delay and generating incorrect sequence components during input signal changes, because the data window spans the instant of signal change. As shown in FIG. 7, the samples in the data window contain both pre-change and post-change information so that equation (20) cannot give a correct output. If the output is used as a reference signal, it will cause appreciable errors.

In one embodiment of the invention, successive application of the half angle formula to equation (19) reduces the delay substantially. The half angle formula is:

$$e^{j\beta} = 2\cos\frac{\beta}{2} e^{j\frac{\beta}{2}} - 1 \quad (21)$$

For a specific example, applying equation (21) recursively four times for an angle of $-120°$ and $120°$ gives $$e^{-j120°} = 6.635 \cdot e^{-j7.5°} - 7.078 \quad (22)$$

and $$e^{-j240°} = -e^{-j120°} - 1 = -6.635 \cdot e^{-j7.5°} + 6.078 \quad (23)$$

respectively. Substituting equations (22) and (23) into (19) gives $$3V_+ V_a + 6.078 V_b - 6.635 e^{-j7.5°} V_b - 7.708 V_c + 6.635 e^{-j7.5°} V_c \quad (24)$$

The sampling frequency given a base frequency ($F_n = 60$ Hz) and a phase shift of $-7.5°$ between sampling events is $F_s = 360/7.5 \cdot F_n = 2880$ Hz. The following discrete representation is obtained from equation (24), $$3V_+(k) = V_a(k) + 6.078 V_b(k) - 6.635 V_b(k-1) - 7.078 V_c(k) + 6.635 V_c(k-1) = V_a(k) + 6.078[V_b(k) - V_c(k)] - 6.635 [V_b(k-1)] - V_c(k) \quad (25)$$

The positive sequence output is generated with only one sample delay. The duration of the delay can be reduced even further by continuing to apply equation (21) recursively. The computation of equation (25) requires only 1+2 multiplications and 5 additions or subtractions.

One main restriction of the technique is that the sampling frequency must be precisely $3 \times 2^n$ times the input frequency. This can be overcome by using the method developed in the following embodiment which applies the above principles to an arbitrary sampling frequency.

It is known that a phasor can be constructed from two other phasors. Our objective is to represent the phasors $e^{-j120°}$ and $e^{-j240°}$ in equation (18a) in terms of $P_b - Z_b e^{-j\beta}$ and $-P_c + Z_c e^{-j\beta}$ respectively, where $\beta$ represents the phase shift related to one sample delay at an arbitrary sampling frequency. The desired result is shown in equation (26).

$$3V_+ = V_a + P_b V_b - Z_b V_b e^{-j\beta} - P_c V_c + Z_c V_c e^{-j\beta} \quad (26)$$

Given sinusoidal signals with base frequency $F_n$ at a sampling rate $F_s$, the phase shift $\beta$ of one sample delay is equal to $2\pi \cdot F_n / F_s$. Then the coefficients in the above equation can be derived as follows:

$$P_b = \frac{1}{\tan(30° + \beta)\cos\ 30° - \sin\ 30°}; \quad (27)$$

$$Z_b = \frac{1}{\sin(30° + \beta) - \cos(30° + \beta)\tan 30°}; \quad (28)$$

$$P_c = \frac{1}{\sin\ 30° - \tan(30° - \beta)\cos 30°}; \text{ and} \quad (29)$$

$$Z_c = \frac{1}{\cos(30° - \beta)\tan\ 30° - \sin(30° - \beta)}. \quad (30)$$

The frequency tracking and variable sampling techniques developed in [5] are exploited here. Since the sampling frequency $F_s$ is proportional to the base frequency, $\beta$ is a constant. In other words, the filter coefficients do not have to be adapted. The performance of this algorithm combined with a variable sampling multirate PLL is described in greater detail below.

In the time domain, equation (26) has the following discrete form:

$$3V_+(k)=V_a(k)+P_bV_b(k)-Z_bV_b(k-1)-P_cV_c(k-1) \quad (31)$$

The equation can be used to extract the positive sequence component at any sampling frequency.

From the output waveforms of the positive sequence component (FIG. 8), it can be observed that impulse points occur at the instant of an input signal change. The technique cannot work well in this situation because one sample represents the pre-change data and the other is the post-change data in the data window.

In a preferred embodiment, this phenomenon is effectively removed by using a median filter of length 3. This filter introduces one sample delay. MATLAB simulations indicate satisfactory results as shown in FIG. 8.

The frequency response of the sequence extraction filter is computed to ensure that any effects can be accurately compensated by other functional blocks in the overall synchronization scheme. To compute the frequency response, consider that the incoming waveform is composed of a positive sequence waveform. In this event, $V_b$ is displaced with respect to $V_a$ by $-120°$ degrees and $V_c$ is displaced with respect to $V_a$ by $120°$ degrees. By substituting $\beta=2\pi \cdot f_b/F_s$ into equation (26), representing $V_b$ and $V_c$ in terms of a phase shifted $V_a$, and dividing both sides by the magnitude of $V_a$, we obtain the following per-unit equation:

$$3V_+(f) = 1 + P_b e^{j240°} - Z_b e^{-j\left(240°-\frac{2\pi f}{F_s}\right)} - P_c e^{j120°} + Z_c e^{-j\left(120°-\frac{2\pi f}{F_s}\right)} \quad (32)$$

The frequency response of the proposed sequence component filter is shown in FIG. 9. The response characteristics are similar to those of high pass filters, so low pass or band pass filters must follow this filter in order to attenuate harmonics effectively.

Negative sequence extraction filters are designed analogously using equation (18b) and the same technique exploited earlier:

$$3V_-=V_a-P_cV_b+Z_cV_b e^{-j\beta}+P_bV_c-Z_bV_c e^{-j\beta} \quad (33)$$

The coefficients are the same as in the positive sequence method. In the time domain, equation (33) has the following discrete form:

$$3V_-(k)=V_a(k)-P_cV_b(k)+Z_cV_b(k-1)+P_bV_c(k)-Z_bV_c(k-1) \quad (34)$$

The discrete form of the zero sequence component can be directly derived from (18c) and is shown as follows:

$$3V_0(k)=V_a(k)+V_b(k)+V_c(k) \quad (35)$$

Hitherto, fast retrieval of sequence components in three phase networks is achieved by using equation (31), (34) and (35).

Simulations on MATLAB™ demonstrate the high level of performance of the proposed method in measuring the positive and negative sequence components at the time of an abrupt transition. A step change in the input signal magnitude results in the display of a correct output after one sample delay ($T_s=1/F_s$). In contrast (FIG. 10), the conventional method will generate the correct output after a delay of $2T_n/3$.

Various situations are simulated using MATLAB™, including changes in the magnitude of the 3-phase input signal.

FIG. 11(a) shows three different input phase signals over the time span 0 to t4. From 0 to t1, the inputs are 3-phase symmetrical positive sequence components and the magnitude changes from 0.5 to 1 at t1. The 3-phase input signals change to a zero sequence component at t2, a negative sequence component at t3, and finally back to a positive sequence component at t4.

FIG. 11(b) and FIG. 11(c) show the positive and negative sequence outputs respectively. Simulation results show that a fast transient response is achieved and the output patterns of sequence components precisely follow the variations of the input signals.

Since the performance of the positive sequence filter is affected by the input frequency variation, frequency tracking with a variable sampling multi-rate PLL is utilized. The variable sampling multi-rate PLL is described in U.S. provisional application 60/369,937, filed Apr. 4, 2002, from which this invention claims priority. The positive sequence extraction is compatible with PLL frequency tracking and filtering without phase error, and the combination is shown in FIG. 12.

The system in FIG. 12 contains a three phase analog-to-digital converter (A/D), a positive sequence filter, an antialiasing filter (B), a downsampler ($\downarrow$N), a controller (K), a numerically controlled oscillator (NCO), and an automatic gain controller (AGC) controlled by a feedforward signal representing an estimation of the positive sequence amplitude (E). The fundamental component, or base frequency, is obtained through a synchronously sampled Discrete Fourier Transform. The sampling frequency is determined by the NCO frequency. The PLL operates at the slow sample rate, whereas the input signal is sampled at the fast sample rate. The PLL tracks the input signal frequency and keeps the sampling frequency of the system accurately synchronized to a multiple of the power system frequency, and thereby eliminates the impact of frequency variations on the filter performance.

The operation of the PLL is discussed as follows: The PLL error signal (e) is used to modify the NCO frequency during transients. The PLL feedback action is such that the error is forced to zero in the steady state. When zero error is achieved, the input signal is sampled exactly at zero crossings and the PLL is locked. The multi-rate PLL is also a variable sampling rate system since the sampling frequency is adapted to the frequency of input signals at all times. The sample rate that is much higher than the input signal frequency is referred to as the fast sample rate. The sample rate that is equal to the input frequency is referred to as the slow sample rate. (In cases where the phase-locked loop operates on both the positive going and negative going zero-crossing the slow sample rate is twice the input frequency). The fast sample rate is a multiple of the slow sample rate, and in a preferred embodiment the multiple is an integer N associated with the oversampling ratio. Oversampling is a technique used in digital signal processing. To avoid aliasing in those parts of the system operating at the slow sample rate, the antialiasing filter must precede the sample rate reduction block (downsampler).

The positive sequence filter derived above has a highpass characteristic, therefore a lowpass or bandpass filter is required to attenuate harmonic components. The positive sequence filter will also introduce a phase delay of one sampling period. This phase delay has to be compensated in order to achieve no phase shift between the input and output signals. The antialiasing filter (block B in FIG. 12) prevents antialiasing after the downsampler, attenuates harmonics and compensates for the phase delay simultaneously; this filter can be realized using a phase-lead-bandpass FIR or IIR filter. In a preferred embodiment, the filter is a dual IIR bandpass filter with disturbance detection and reinitialization designed according to the specification in part 1 above.

The frequency response is not affected by frequency variations since the sampling frequency is a multiple of the base frequency at all times except during a transient.

As an example, we have a Blackman window based bandpass FIR filter of order Nbo=512 and the positive sequence filter output delay that is d=1. We modify the filter length Nbo to introduce a phase lead to compensate for this delay. We consequently obtain a bandpass filter of order Nb=510. FIG. 13 displays the simulation results for a frequency step change from 60 Hz to 61 Hz at time=0s.

The output will synchronize with the input approximately 0.6 seconds after a step change in frequency occurs. The zoomed waveform in FIG. 13(b) shows that the zero-crossing point of the extracted positive sequence fundamental component is precisely in phase with the phase-a input after the new steady state is achieved. FIG. 14 shows that the frequency response of the whole system has an ideal bandpass feature and the attenuation is greater than 80 dB at 120 Hz, 180 Hz, and higher order harmonics.

The antialiasing filter (Block B in FIG. 12) can also be realized with a bandpass IIR filter that generates no phase error between the input and output. The IIR filter requires a lower filter order compared to the FIR filter and greatly reduces the computational complexity.

The system may be implemented in numerous ways. FPGAs/FPLDs are becoming more popular for hardware implementation because of their programmability and reduced development costs. This makes them ideal for rapid development and prototyping. The implementation of a 16-bit positive sequence filter has been performed on the University of Toronto Ultragizmo Board with an Altera EPF10K70 chip. Computations that maintain full precision of the intermediate data are possible. The system architecture is shown in FIG. 15. A 16-bit multiplier is shared in order to reduce the number of gates used, while a three point median filter is used to eliminate impulse noise at the instant of change. The maximum sampling rate of 2 MHz can be achieved if the system clock rate is 20 MHz.

In another example, a 7.68 Khz sampling rate filter is constructed and simulated using the MAX+PLUS II™ development tool. To verify the implemented circuitry, various input vectors must be generated. This is complex and tedious if the coding is performed solely in VHDL. As shown in FIG. 16, input vectors for MAX+PLUS II™ can be generated easily by MATLAB™ and the output waveform can be easily plotted for verification.

Several input scenarios are simulated and the MAX+PLUS II™ results in FIG. 18 compare satisfactorily with MATLAB simulations in FIG. 17. The design is sound.

The design is then ported to an EPF10K70 FPGA chip and tested with a 68000 microprocessor on the Ultragizmo Board (FIG. 15). Using the input vector plotted in FIG. 17(a), the test results are exactly the same as the MAX+PLUS II simulation results as shown in FIG. 18.

THE MOST PREFERRED EMBODIMENT

FIG. 1 shows the system on a chip architecture for sequence component extraction and a dual IIR filter with reinitialization for fault/disturbance detection. The variable sample period ($T_s=1/F_s$) is produced by a frequency tracking phase locked loop (PLL) and is used for sequence extraction and executing the IIR filter algorithms. The input signal is sampled by an analog to digital conveter with sample period $T_s$. Sequence component extraction filters, also operating with sample period $T_s$, i.e. at sample rate $F_s$, output the positive sequence, negative sequence and neutral sequence components to the error sequence extraction blocks shown once in Region A of FIG. 1.

Region A, delineated by the dotted lines in FIG. 1, shows the preferred orientation of components sufficient to create a fast response, high noise attenuation, dual IIR filter with re-initialization and fault/disturbance detection. One dual IIR filter set is associated with each of the three sequence component sample streams (+, −, 0). The sampling rate is based on an integer multiple of the base frequency as determined by a phase locked loop external to the filter and fed in as the sampling period $T_s$. For each of the three power signal component streams, the output of the high quality factor IIR filter is compared to the phase matched output of the low quality factor IIR filter to detect faults. Where no fault is detected, the output of the high quality factor IIR filter is phase delayed to a total of 360 degrees to match the input signal. Where a fault is detected, the low quality factor IIR filter outputs are used to re-initialize the high quality factor IIR filter registers. In this way, the response time of the system is limited by the low quality factor IIR filter and the attenuation level is limited by the high quality factor IIR filter.

To prevent changes in amplitude of the input signal from affecting the PLL algorithm, an amplitude estimation block (shown at E in FIG. 12) can estimate the amplitude of the fundamental harmonic of each of the three sequence component sample streams using the discrete-time Fourier series of that sequence component. While the amplitude estimate would be available at any rate between the fast sample rate and the slow sample rate, the point at which scaling occurs (1/x AGC in FIG. 12) may occur either before or after downsampling filter output sequence depending on designer requirements. For simplicity automatic gain control is not shown in FIG. 1, but we can assume that the amplitude estimation and downsampling occurs at some point between sequence component extraction on the PLL control algorithm.

A comprehensive power signal processing unit can be created in this way to provide any of the following signals:
the disturbance or fault detection signal,
the filtered 360 degree phase shift fundamental components,
the filtered fast transient response fundamental components, and
the synchronous sampling clock signal.

The system has special features that make it preferable to other designs. The dual IIR filter can be used in place of memory, reducing chip size. A single numerically controlled oscillator generates a variable sampling signal for all functional blocks, greatly simplifying the architecture. All intermediate signals are available for improved functionality.

It is currently feasible to implement, using a monolithic architecture, all of the above functions with an application specific integrated circuit (ASIC) or field programmable gate array (FPGA) technology on one physical platform.

The use of two IIR filters per sequence component stream instead of one FIR filter per stream allows for a design with a smaller number of gates and hence less silicon. Also, the use of a variable sample rate execution reduces the amount of gates required and makes the idea of a system on a chip practical. Moreover, the variable sample rate clock is available to other modules hence simplifying the integration of different modules.

Since the above design shows how the phase delay caused by the dual IIR filter is tuned to 360 degrees of the underlying power signal, the dual IIR filter operates as a memory element. This memory effect is evident at all times. Under steady state conditions, the current information and the information from the previous period are the same and thus the error signal is zero. A disturbance will cause this error signal to deviate from zero after one sample delay. The 360 degree delay allows filtered sequence component samples to be returned in a timely manner for use in the sequence component extraction process.

The present invention has been described with respect to three-phase networks and 60 Hz power signals as particular embodiments. It will be appreciated by those of ordinary skill in the art that, in light of the present disclosure, the system and methods described allow for synchronization of multivariate signals at other frequencies and in other contexts, without departing from the intended scope of the invention. All such modifications are intended to be included within the scope of the appended claims.

All publications, patents and patent applications are incorporated by reference in their entirety to the same extent as if each individual publication, patent or patent application was specifically and individually indicated to be incorporated by reference in its entirety.

The invention claimed is:

1. A 360 degree phase delay digital filtering system for filtering a digital sequence, the digital sequence being a sequence of samples from a frequency and amplitude varying input signal, comprising:
   a higher stopband attenuation slower transient response bandpass infinite impulse response filter (hereinafter called "High Q BP IIR filter") and a lower stopband attenuation faster transient response bandpass infinite impulse response filter (hereinafter called "Low Q BP IIR filter") each for accepting the digital sequence and for outputting a first and second filtered output respectively;
   the High Q BP IIR filter having a first state register and operating at a center frequency;
   an output phase shifter to delay the first filtered output to a total of one period of the center frequency as compared to the input signal;
   the Low Q BP IIR filter having a second state register and operating at the same center frequency;
   an intermediate phase shifter to synchronize the second filtered output to the first filtered output;
   a disturbance detector for comparing the first and second filtered outputs and for signalling a disturbance where the difference between the synchronized outputs is greater than a threshold level;
   a switch for replacing the contents of the first state register with the contents of the second state register when the disturbance detector signals a disturbance.

2. A fast sequence component extraction and signal synchronization system, for tracking a three phase signal with a variable fundamental frequency or variable amplitude, comprising
   an analog to digital converter for sampling the three phase signal at a fast sample rate and for generating a digital sequence, the fast sample rate being sufficiently large to avoid aliasing and being an integer multiple of a slow sample rate;
   three or sequence extraction blocks, one for each of a positive sequence, negative sequence and neutral sequence component of a disturbed three phase signal, each including:
      a component extraction filter for accepting the digital sequence and for outputting its respective positive sequence, negative sequence or neutral sequence components;
      a digital bandpass filter for filtering the respective sequence component and for outputting a respective positive sequence, negative sequence or neutral sequence component filter output, the digital bandpass filter having a center frequency which depends on the fast sample rate;
      an amplitude estimation block for receiving the respective sequence component and for generating an amplitude estimate for a fundamental harmonic of the respective sequence component of the three phase signal;
      a gain control block for scaling the respective filter output, or a subsequence thereof, by the inverse of the respective amplitude estimate and for outputting a respective positive sequence, negative sequence and neutral sequence component scaled sequence;
   a controller for receiving three error sequences at the slow sample rate and for outputting a controller output with anti-wind up protection to a numerically controlled oscillator, the controller controlling the numerically controlled oscillator in order to track the variable fundamental frequency of the three phase signal according to a phase-locked loop algorithm, the three error sequences being the positive sequence, negative sequence and neutral sequence component scaled sequences, or subsequences thereof, and the phase-locked loop algorithm operating on each of the error sequences to force the error sequences to zero;
   the numerically controlled oscillator for receiving the controller output, for generating a clock signal frequency based on the controller output and which clock signal frequency determines the fast sample rate of the analog to digital convener which in the steady-state is synchronized with the fundamental frequency of the three phase signal.

3. The fast sequence component extraction and signal synchronization system of claim 2 wherein at least one of the digital bandpass filters is a 360 degree phase delay digital filtering system comprising:
   a higher stopband attenuation slower transient response bandpass infinite impulse response filter (High Q BP IIR filter) and a lower stopband attenuation faster transient response bandpass infinite impulse response filter (Low Q BP IIR filter) each for accepting the same one of the sequence components and for outputting a High Q BP IIR filter output and a Low Q BP IIR filter output respectively the High Q BP IIR filter having a first state register and operating at the center frequency;
   an output phase shifter to delay the High Q BP IIR filtered output to a total of one period of the center frequency as compared to the input signal, which delayed signal is the filtered output;
   the Low Q BP IIR filter having a second state register and operating at the center frequency;
   an intermediate phase shifter to synchronize the High Q BP IIR filter output and the Low Q BP IIR filter output;
   a disturbance detector for comparing the synchronized High Q BP IIR filter output and Low Q BP IIR filter output and for signalling a disturbance where the difference between the synchronized outputs is greater than a threshold level;

a switch for replacing the contents of the first state register with the contents of the second state register when the disturbance detector signals a disturbance.

4. The fast sequence component extraction and signal synchronization system of claim 2 wherein the error sequence extraction blocks further comprises a downsampler for sampling the filter output of the digital bandpass filter at the slow sample rate.

5. The fast sequence component extraction and signal synchronization system of claim 2 wherein the error sequence extraction blocks further comprises a downsampler for sampling the output of the gain control block at the slow sample rate.

6. The fast sequence component extraction and signal synchronization system of claim 2 wherein the integer multiple is a power of 2.

7. The fast sequence component extraction and signal synchronization system of claim 2 wherein the anti-wind up protection is obtained by using saturation at the controller output.

8. The fast sequence component extraction and signal synchronization system of claim 7 wherein the controller is a proportional integral controller.

9. The fast sequence component extraction and signal synchronization system of claim 7 wherein the controller is a minimum response time controller.

10. The fast sequence component extraction and signal synchronization system of claim 2 wherein the slow sample rate in steady-state is equal to the fundamental frequency of the input signal.

11. The fast sequence component extraction and signal synchronization system of claim 2 wherein the slow sample rate in steady-state is equal to two times the fundamental frequency of the input signal and the phase-locked loop algorithm uses both negative going and positive going zero-crossings.

12. The fast sequence component extraction and signal synchronization system of claim 2 wherein at least one of the digital bandpass filters is a Blackman window based finite impulse response bandpass filter of order 512.

13. The fast sequence component extraction and signal synchronization system of claim 2 wherein the amplitude estimation block generates the respective amplitude estimation at any rate between the fast sample rate and the slow sample rate by computing the fundamental harmonic of the respective sequence component of the three phase signal using the discrete-time Fourier series of that sequence component, or a subsequence thereof.

14. A method of filtering a digital sequence, the digital sequence being a sequence of samples from a frequency and amplitude varying input signal, comprising
  accepting the digital sequence with a higher stopband attenuation slower transient response bandpass infinite impulse response filter (hereinafter called "High Q BP IIR filter") wherein the High Q BP IIR filter has a first state register and operates at a center frequency;
  outputting a first and second filtered output with a lower stopband attenuation faster transient response bandpass infinite impulse response filter (hereinafter called "Low Q BP IIR filter") wherein the Low Q BP IIR filter has a second state register and operates at the same center frequency;
  delaying the first filtered output to a total of one period of the center frequency as compared to the input signal with an output phase shifter;
  synchronizing the second filtered output to the first filtered output with an intermediate phase shifter;
  comparing the first and second filtered outputs and signaling a disturbance where the difference between the synchronized outputs is greater than a threshold level, with a disturbance detector;
  replacing the contents of the first state register with the contents of a second state register when the disturbance detector signals a disturbance, with a switch.

* * * * *

UNITED STATES PATENT AND TRADEMARK OFFICE
CERTIFICATE OF CORRECTION

PATENT NO.        : 7,180,940 B2
APPLICATION NO. : 10/407901
DATED              : February 20, 2007
INVENTOR(S)       : Chunlin Li and Francis Dawson It is certified that error appears in the above-identified patent and that said Letters Patent is hereby corrected as shown below:

Claim 2, column 15, line 64, should read as follows:

--three error sequence extraction blocks, one for each of a--.

Signed and Sealed this

Fifteenth Day of May, 2007

JON W. DUDAS
*Director of the United States Patent and Trademark Office*